(12) United States Patent
Li

(10) Patent No.: US 6,891,764 B2
(45) Date of Patent: May 10, 2005

(54) APPARATUS AND METHOD TO READ A NONVOLATILE MEMORY

(75) Inventor: Bo Li, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/411,702

(22) Filed: Apr. 11, 2003

(65) Prior Publication Data

US 2004/0202038 A1 Oct. 14, 2004

(51) Int. Cl.$^7$ .................................................. G11C 7/00
(52) U.S. Cl. .............. 365/189.09; 365/226; 365/189.01; 327/536
(58) Field of Search ................. 365/189.09, 189.01, 365/189.11, 185.18, 226; 327/536, 537, 535, 540, 541

(56) References Cited

U.S. PATENT DOCUMENTS

| | | | | |
|---|---|---|---|---|
| 5,291,446 A | * | 3/1994 | Van Buskirk et al. | 365/189.09 |
| 5,546,042 A | * | 8/1996 | Tedrow et al. | 327/538 |
| 5,602,794 A | * | 2/1997 | Javanifard et al. | 365/226 |
| 5,835,420 A | * | 11/1998 | Lee et al. | 365/189.09 |
| 5,991,221 A | * | 11/1999 | Ishikawa et al. | 365/226 |
| 6,075,397 A | * | 6/2000 | Yamada | 327/262 |
| 6,255,896 B1 | | 7/2001 | Li et al. | |
| 6,292,048 B1 | | 9/2001 | Li | |
| 6,373,324 B2 | | 4/2002 | Li et al. | |
| 6,441,678 B1 | | 8/2002 | Zeng et al. | |
| 6,496,055 B2 | | 12/2002 | Li | |
| 6,642,774 B1 | * | 11/2003 | Li | 327/536 |

OTHER PUBLICATIONS

U.S. Appl. No. 10/187,219, filed Jun. 28, 2002, to Bo Li, pending.

* cited by examiner

*Primary Examiner*—Gene N. Auduong
(74) *Attorney, Agent, or Firm*—Blakely, Sokoloff, Taylor & Zafman LLP

(57) ABSTRACT

Briefly, in accordance with an embodiment of the invention, a single charge pump is discussed that may provide a read voltage having a tolerance of less than about ±200 millivolts (mV) at an output terminal of the single charge pump. The output terminal of the single charge pump may be coupled to a flash memory to couple the read voltage to the memory to read information stored in the memory.

24 Claims, 13 Drawing Sheets

APPARATUS AND METHOD TO READ A NONVOLATILE MEMORY

BACKGROUND

Many of today's computing applications such as cellular phones, digital cameras, and personal computers, use nonvolatile memories to store data or code. Nonvolatility is advantageous because it allows the computing system to retain its data and code even when power is removed from the computing system. Thus if the system is turned off or if there is a power failure, there is no loss of code or data.

One example of a nonvolatile memory device is the flash Electrically Erasable Programmable Read-only Memory (flash EEPROM or flash memory). Flash memory can be programmed by the user, and once programmed, the flash memory retains its data until the memory is erased. Electrical erasure of the flash memory erases the contents of the memory of the device in one relatively rapid operation. The flash memory may then be programmed with new code or data.

Flash memories have been used in portable computers and similar circuitry as both read only memory and as long term storage which may be both read and written. However, the tendency has been to reduce the power requirements of such portable computers to make systems lighter and to increase the length of use between recharging. This has resulted in the supply voltage potentials available to operate the flash memory arrays being reduced.

In some systems, the voltages used to store and read information in memories may be higher than the supply voltage. In order to achieve the higher voltages, charge pumps may be used to generate these voltages. The use of a charge pump may increase the power consumption and die size of an application using the charge pump.

Thus, there is a continuing need for alternate charge pumps having relatively low power consumption and die size.

BRIEF DESCRIPTION OF THE DRAWINGS

The subject matter regarded as the invention is particularly pointed out and distinctly claimed in the concluding portion of the specification. The present invention, however, both as to organization and method of operation, together with objects, features, and advantages thereof, may best be understood by reference to the following detailed description when read with the accompanying drawings in which:

Figure 1:
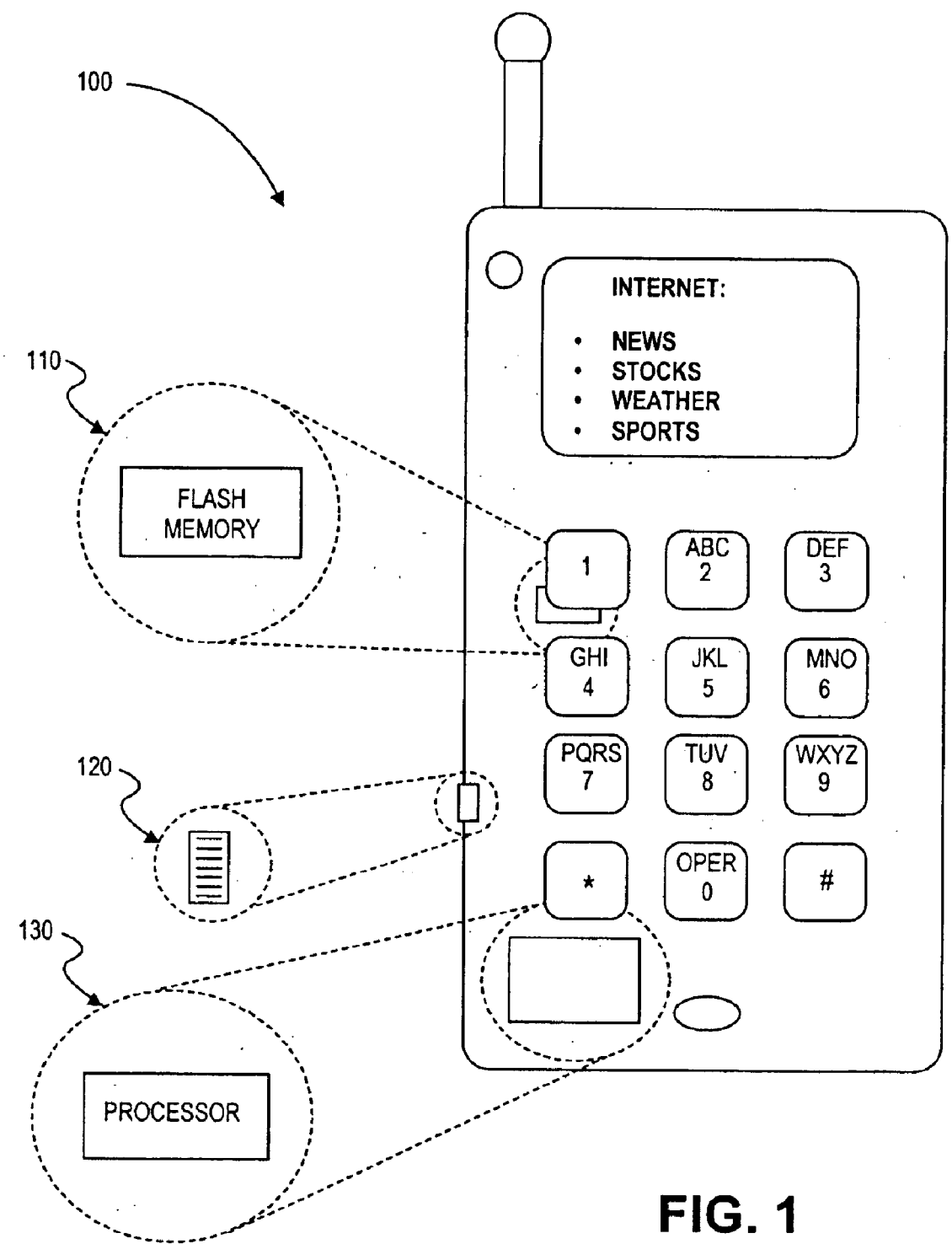
FIG. 1 illustrates one embodiment of a cellular telephone using a flash memory device.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the present invention. However, it will be understood by those skilled in the art that the present invention may be practiced without these specific details. In other instances, well-known methods, procedures, components and circuits have not been described in detail so as not to obscure the present invention.

A method and apparatus for a high precision charge pump regulation is disclosed. The embodiments described herein are described in the context of a memory, but are not so limited. Although the following embodiments are described with reference to a flash memory, other embodiments are applicable to other types of integrated circuits or logic devices. The same techniques and teachings of the present invention may be applied to other types of circuits or semiconductor devices that use charge pumps.

A flash EEPROM memory device (cell) may be a floating gate metal-oxide semiconductor (MOS) field effect transistor having a drain region, a source region, a floating gate, and a control gate. Conductors may be connected to each drain, source, and control gate for applying signals to the transistor. A flash EEPROM cell may be capable of functioning in the manner of a normal EPROM cell and may retain a programmed value when power is removed from the circuitry. A flash EEPROM cell may typically be used to store a one or zero condition. If multilevel cell (MLC) technology is used, multiple bits of data may be stored in each flash EEPROM cell. Unlike a typical EPROM cell, a flash EEPROM cell is electrically erasable in place and does not need to be removed and diffused with ultraviolet to accomplish erasure of the memory cells.

As supply voltages and device sizes continue to decrease, the sensitivity of flash cell devices to variations in temperature, manufacturing processes, and supply voltages does not. Furthermore, as more flash memory devices make use of MLC technology, the circuitry may use more stringent supply voltages and sensing capabilities. This is because MLC flash cells may be more susceptible to data errors due to tighter threshold voltage (Vt) ranges in the storage of data bits. For example, a single bit flash cell may use an entire voltage range such as from 2.0 volts up to 4.0 volts to store the value of a single bit a data. For simplicity, the cutoff threshold for determining whether the flash cell is storing a '1' or a '0' bit is 3.0 volts. Thus if the Vt value of a flash cell is greater than 3.0 volts, a '1' is stored therein and if the Vt value is less than 3.0 volts, a '0' is stored therein. But with a MLC flash cell, two bits of data may be stored within the same voltage range of 2.0 volts to 4.0 volts. So the two bits in the single MLC flash cell may store "1, 1" if the Vt value is greater than 3.5 volts, "1, 0" if the Vt value is between 3.0 volts and 3.5 volts, "0, 1" if the Vt value is between 2.5 volts and 3.0 volts, and "0, 0" if the Vt value is less than 2.5 volts. The voltage values of this example have been randomly picked for ease in discussion, but actual voltage values can be much more precise and the range much smaller.

Existing power circuits do not provide accurate enough voltage levels and can easily vary ±450 millivolts (mV) from the target value. Whereas a pump voltage variation of between ±350 mV to 550 mV may be tolerable in a single bit flash environment, a MLC flash environment may require variations to be less than ±50 mV. A single bit flash cell may still correctly sample, read, verify, and operate with large voltage variations where a MLC flash cell may not. Circuits pertaining to read operations are extremely sensitive. Read windows and regulation can be the most sensitive circuits of MLC parts because of the voltage tolerances. Thus tighter control of the voltages for programming, erasing, sensing, etc. is necessary in order to store and read the correct data values.

MLC flash memory generally needs high precision wordline voltages. The segmentation of the threshold voltage ranges for data storage in a MLC flash cell makes the devices more sensitive to voltage levels. Precise voltage levels may be needed in order to achieve tight, precise Vt distributions on the flash cells. General charge pump regulation, as well as a second layer of voltage regulation, may be needed to achieve a lower supply voltage variation from the pump supply. However, the present read regulation schemes are extremely costly both in terms of power and die size area. Furthermore, read regulators increase the complexity of the architecture and design of the chip.

Embodiments of the present invention can provide more accurate supply voltages from charge pumps. For instance, one embodiment of the present invention uses a new single pump regulation circuit to achieve high precision voltage control of approximately ±50 mV within the target value across a variety of VCC supply voltages, temperatures, and manufacturing process corners. In another embodiment, a single charge pump is provided that generates a pumped output voltage having a tolerance of less than about ±200 mV. This output voltage may be transferred to a memory cell during programming or reading of a memory cell. Programming may include a verify operation for verifying that a memory cell has been programmed intro a desired memory state.

Referring now to FIG. 1, there is an example of a cellular telephone 100 using a flash memory device 110 that may use a charge pump in accordance with an embodiment of the present invention. The cellular telephone 100 shown in FIG. 1 is a digital phone capable of internet access. For example, a user can download and receive information from the Internet via cellular access. This cellular phone 100 can be a Personal Communications Service (PCS) phone using digital cellular technology such as Code-Division Multiple Access (CDMA), Time Division Multiple Access (TMDA), or Global System for Mobile (GSM) Communications. Similarly, flash memory can also be used in analog type cellular phones. Thus, the present invention is not limited to any specific combination of hardware circuitry and software.

Flash memory 110 and a processor 130 may be located within cellular phone 100. Flash memory 110 may be designed to include a fast program mode. Processor 130 can be an embedded processor or a digital signal processing (DSP) chip. The phone 100 of FIG. 1 also includes a access port 120. Access port 120 can be used to physically link the phone 100 to an external system for code and/or data update. For instance, the flash memory can be updated through the access port interface or through a download via cellular transmission.

A memory update via the access port 120 is an example of an in-system write. In-system write utilizes the system processor 130 to execute flash memory erase and program algorithms. An engineer creates erase, program and verify algorithms and then downloads these algorithms into the system random access memory (RAM). The processor 130 executes the algorithms and ports code to the flash memory 110 for updates. In-system write is also a way to perform PC BIOS code updates.

The present invention is not limited to cellular phones. Alternative embodiments of the present invention can be used in other types of devices such as handheld devices and embedded applications. Some examples of handheld devices include Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system which uses flash memory for other embodiments. Flash memory is also used in personal computers (PC) and other computer systems.

For another embodiment of a system, a charge pump can be used with a system on a chip. One embodiment of a system on a chip comprises of a processor and a memory. The memory for one system is a flash memory. The flash memory can be located on the same die as the processor and other system components. Additionally, other logic blocks such as a memory controller or graphics controller can also be located on a system on a chip. By including one embodiment of the present invention on the system on a chip, the flash memory can be updated quickly and with minimal inconvenience to a user.

Figure 2:
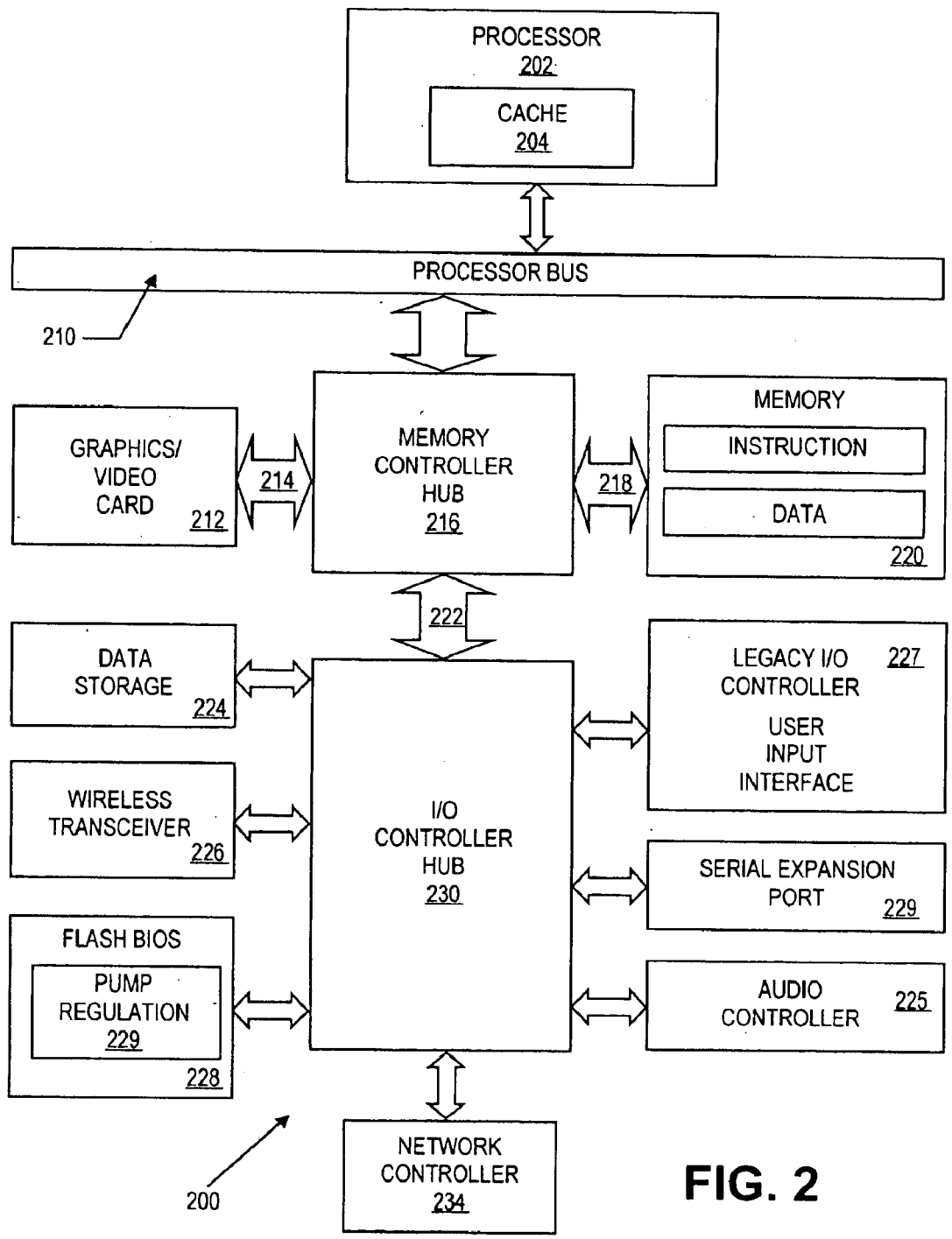
FIG. 2 is a block diagram of one embodiment of a computer system including a component utilizing a high precision charge pump regulation in accordance with the present invention.

Referring now to FIG. 2, an exemplary computer system 200 is shown. System 200 includes a component, such as a flash memory, to employ a high precision charge pump regulation in accordance with the present invention, such as in the embodiment described herein. System 200 is representative of processing systems based on the PENTIUM® III, PENTIUM® 4, Itanium™, StrongARM™, and/or Xscale™ microprocessors available from Intel Corporation of Santa Clara, Calif., although other systems (including PCs having other microprocessors, engineering workstations, set-top boxes and the like) may also be used. In one embodiment, sample system 200 may execute a version of the WINDOWS™ operating system available from Microsoft Corporation of Redmond, Wash., although other operating systems (UNIX and Linux for example), embedded software, and/or graphical user interfaces, may also be used. Thus, the present invention is not limited to any specific combination of hardware circuitry and software.

The present enhancement is not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include network computers (NetPC), set-top boxes, network hubs, wide area network (WAN) switches, or any other system that utilizes wireless communications.

FIG. 2 is a block diagram of one embodiment of a computer system 200 including a component utilizing a high precision charge pump regulation in accordance with the present invention. The processor 202 includes an internal cache memory 204. The present embodiment is described in the context of a single processor desktop or server system, but alternative embodiments can be included in a multiprocessor system. System 200 is an example of a hub architecture. The computer system 200 includes a processor 202 to process data signals. The processor 202 can be a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 202 is coupled to a processor bus 210 that transmits data signals between the processor 202 and other components in the system 200.

System 200 includes a memory 220. Memory 220 can be a dynamic random access memory (DRAM) device, a static random access memory (SRAM) device, flash memory device, or other memory device. Memory 220 can store information such as, for example, instructions and/or data represented by data signals that can be executed by the processor 202. An internal cache memory 204 can reside inside the processor 202 to store recently used data signals from memory 220. Alternatively, in another embodiment, the cache memory can reside external to the processor 202.

A system logic chip 216 is coupled to the processor bus 210 and memory 220. The system logic chip 216 in the illustrated embodiment is a memory controller hub (MCH). The processor 202 communicates to the MCH 216 via a processor bus 210. The MCH 216 provides a high bandwidth memory path 218 to memory 220 for instruction and data storage and for storage of graphics commands, data and textures. The MCH 216 is to direct data signals between the processor 202, memory 220, and other components in the system 200 and to bridge the data signals between processor bus 210, memory 220, and system I/O 222. In some embodiments, the system logic chip 216 can provide a graphics port for coupling to a graphics controller 212. The MCH 216 is coupled to memory 220 through a memory interface 218. The graphics card 212 is coupled to the MCH 216 through an Accelerated Graphics Port (AGP) interconnect 214.

System 200 uses a proprietary hub interface bus 222 to couple the MCH 216 to the I/O controller hub (ICH) 230. The ICH 230 provides direct connections to some I/O devices via a local I/O bus. The local I/O bus is a high-speed I/O bus for connecting peripherals to the memory 220, chipset, and processor 202. Some examples are the audio controller 225, firmware hub (flash BIOS) 228, data storage 224, legacy I/O controller 227 containing user input and keyboard interfaces, a serial expansion port 229 such as Universal Serial Bus (USB), and a network controller 234. The data storage device 224 can comprise a hard disk drive, a floppy disk drive, a CD-ROM device, a flash memory device, and/or other mass storage device. Although not shown in FIG. 2, in various embodiments of the present invention, a high precision charge pump may be used with memory 220 and/or data storage 224.

For the embodiment of a computing system 200 in FIG. 2, a wireless transceiver 226 is also coupled to the ICH 230. The wireless transceiver is capable of receiving and transmitting data from the system 200 through the ICH 230 as well as using wireless signals to receive and transmit data from remote systems. Control of the transceiver 226 resides with device driver software and memory 220, which communicates with firmware software and memory residing on the wireless transceiver 226. The processor 202 can execute instructions from memory 220 that cause the processor to send data to and request from the wireless transceiver. Application software and the operating system, working through the wireless transceiver device driver, can interface the wireless transceiver 226. The wireless transceiver enables the system 200 to communicate with other computers and devices that have wireless capability.

Figure 3:
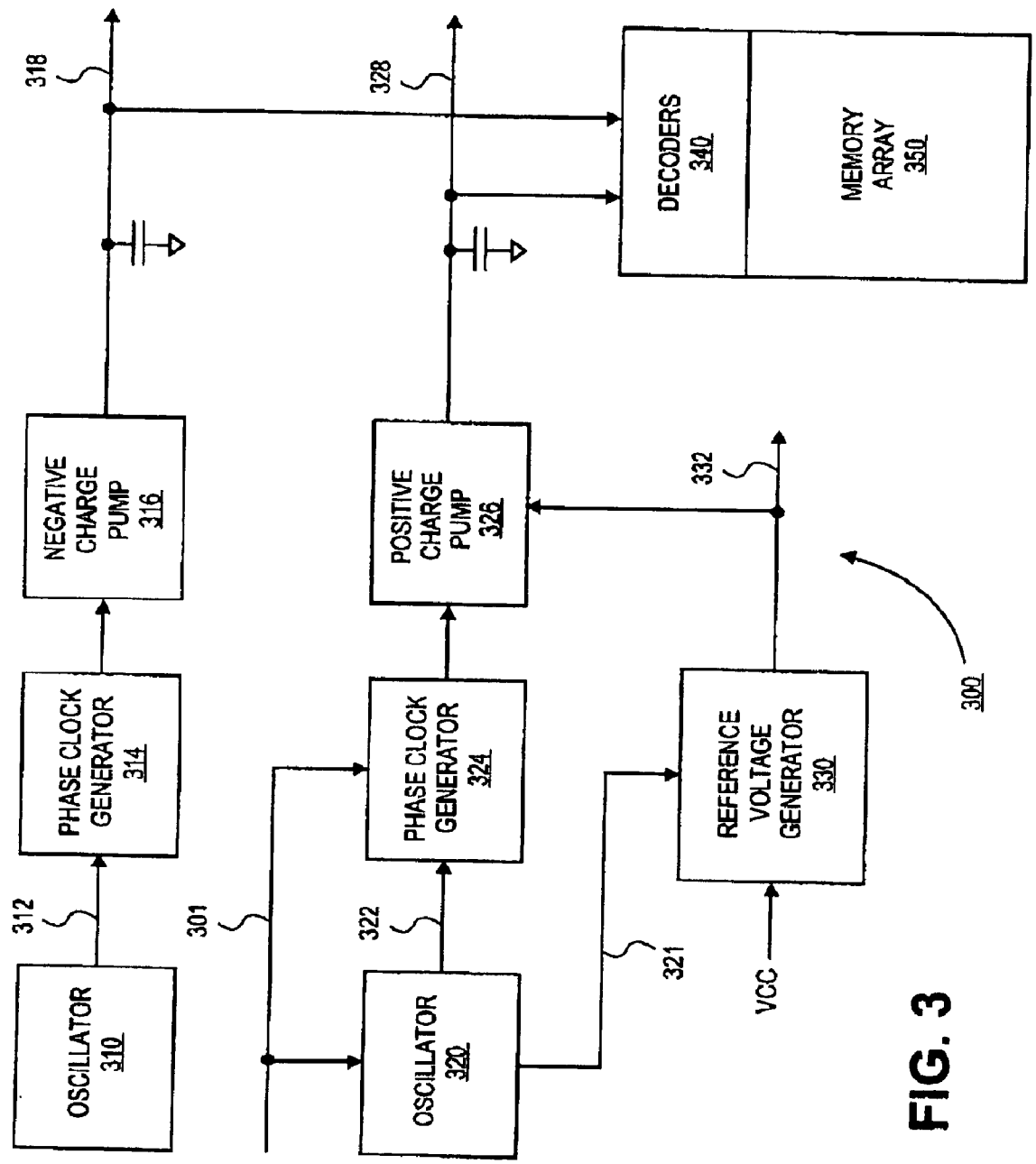
FIG. 3 is a block diagram of a flash memory circuit using a high precision charge pump regulation mechanism of one embodiment.

FIG. 3 is a block diagram of a flash memory circuit 300 using a high precision charge pump regulation mechanism of one embodiment. Reference generator 330 provides a reference voltage 332 to the positive pump 326. For one embodiment, the positive charge pump 326 and negative charge pump 316 include a self initialization mechanism. The positive pump 326 is a single charge pump that provides a regulated voltage of approximately five volts over decoder supply line 328 to the decoders 340 of the memory array 350. The negative pump 316 provides a voltage of approximately negative five volts over decoder supply line 318 to the decoders 340 of memory array 350.

In one embodiment, reference voltage 332 may also be referred to as a supply voltage and may be less than about 5 volts that may be provided to an input terminal of positive charge pump 326. In one example, the single positive charge pump 326 may generate a pumped voltage potential of at least about 5 volts at its output terminal in response to receiving a voltage potential of about 2 volts at its input terminal.

A first oscillator 310 provides a clock signal 312 to a first phase clock generator (or clock driver) 314 that periodically pulses or enables the negative pump 316 during standby mode. A second oscillator 320 provides clock signals 321, 322 to the reference generator 330 and a second phase clock generator 324. The clock signals 322, 321, periodically pulse or enable the positive pump 326 and the reference generator 330, respectively, when they are in a standby mode.

For example, in a standby mode of operation, only one array of switching transistors in charge pump 326 may be periodically triggered during the standby mode, whereas all the arrays of charge pump 326 may be engaged during an active mode of operation. In one embodiment, during standby mode, a pumped voltage may be provided at the output terminal of positive charge pump 326. To ensure that a target pumped voltage is maintained at the output terminal of pump 326, less than all the arrays, e.g., one array, of charge pump 326 may be periodically triggered by applying about a one microsecond pulse (us) from phase clock generator 324 every seven milliseconds (ms). By periodically applying a pulse to at least one array of charge pump 326, this may allow the target pumped voltage to be maintained as the pumped voltage may drop over time due to leakage. During an active mode of operation, all arrays of charge pump 326 may be engaged and charge pump 326 may be operated as discussed below to provide a pumped output voltage having a tolerance of less than about ±200 mV.

The clock signals 312, 321, 322 may each have a different frequency. The phase clock generators 314, 324, drive the pumping action in the negative charge pump 316 and the positive charge pump 326, respectively. Although the pump outputs 318, 328, of this example are shown as primarily driving the decoders 340 and the memory array 350, the pump outputs also supplies other circuitry on the integrated circuit that need supply voltages other than VCC and ground. Decoders 340 may be implemented using switches that may be used for addressing different memory cells within the various memory blocks of memory array 350.

In this flash circuit 300, the pump regulation mechanism includes a control signal 301 that can enable or disable the second oscillator 320 and the second phase clock generator 324 based on input from the positive pump output feedback loop. Before the output node of the positive charge pump 326 is a large filtering diode device that is part of the pump regulation. This large diode couples the pumped supply voltage from the positive charge pump 326 to the memory array 350 via decoders 340. The diode is also coupled to a feedback loop via a resistor divider. This feedback loop operates to help regulate the charge pump operation. Unlike regulation schemes that use read regulator circuits, embodiments of the present invention do not wastefully pump the output voltage level up to unnecessary levels in order to drop the voltage level back down to a desired value with regulation. Pumping a voltage to a voltage level that is not actually needed by circuits at the pump output can increase power consumption and cause heat dissipation issues. Schemes with read regulators can also consume large amounts of die size as the charge pump has to be large to supply enough current. The embodiments of the pump regulation of the present invention take a limited amount of die area as the additional circuitry is minimal.

Figure 4:
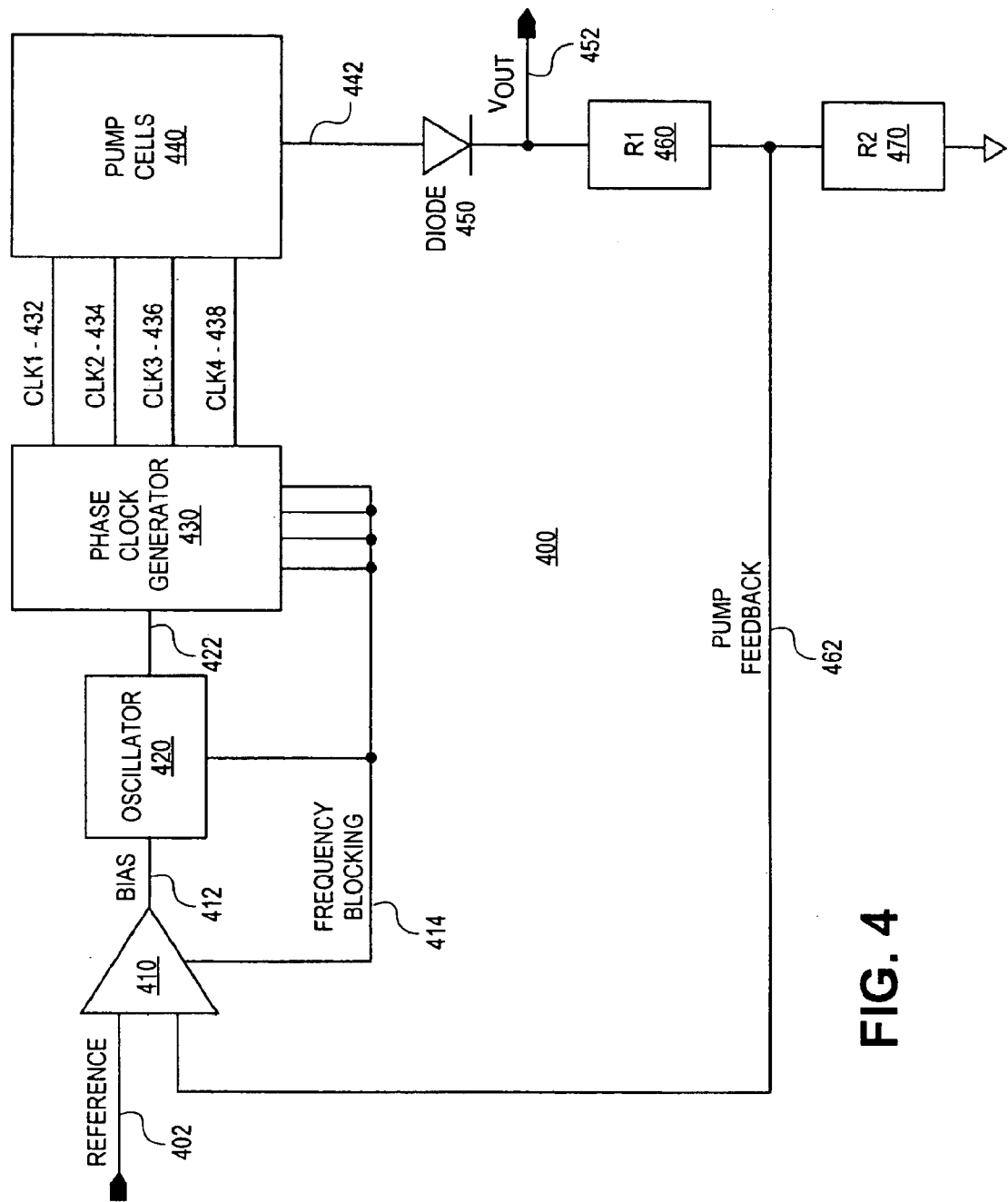
FIG. 4 is a block diagram of one embodiment of a charge pump including a high precision charge pump regulation mechanism in accordance with the present invention.

FIG. 4 is a block diagram of one embodiment of a high precision charge pump 400 including a pump regulation mechanism in accordance with the present invention. This example embodiment describes a pump based regulation design that includes features such as four phase frequency blocking, low pass diode filtering, and a dual port high gain differential amplifier. The pump 400 of this embodiment may be referred to as a single charge pump and can provide an output voltage level that is independent of external current loading.

The single high precision charge pump 400 may be used for the high precision positive charge pump illustrated in the flash circuit 300 illustrated in FIG. 3. In one embodiment, the single charge pump 400 may provide a read voltage having a tolerance of less than about ±200 mV at an output terminal of the single charge pump 400 in response to a supply voltage at an input terminal of the single charge pump 400, wherein the supply voltage is less than the read voltage. The output terminal of the single charge pump 400 may be coupled to a flash memory cell (not shown) to couple the read voltage to the flash memory cell for reading information stored in the memory cell. The flash memory cell may be a MLC adapted to store at least two bits of information.

In one embodiment, the single charge pump 400 may be adapted to provide a read voltage, e.g., at least about five volts, having a tolerance of less than about ±200 mV at its output terminal in response to a positive supply voltage, e.g., less than about five volts, at an input terminal of the single charge pump, wherein the positive supply voltage is less than the read voltage. Charge pump 400 may provide at least one milliampere (mA) of electrical current at its output terminal after receiving the positive supply voltage at the input terminal of the single charge pump. Charge pump 400 may provide the read voltage having a tolerance of less than about ±200 mV and may provide at least about one mA of electrical current at its output terminal in less than about 30 nanoseconds (ns) after transitioning to an active mode from a standby mode or an off condition. Charge pump 400 may provide the target read output voltage, e.g., about 5.7 volts, having a tolerance of less than about ±200 mV and may provide at least about one mA of electrical current at its output terminal in less than about 30 nanoseconds (ns) after transitioning the read output voltage from about zero volts to the target read voltage.

In this embodiment, a comparator 410 receives a reference voltage 402 and a pump feedback voltage 462. The comparator 410 of this embodiment may be referred to as a control circuit and may be a dual port high gain differential amplifier that can provide a digital output and an analog output. The reference voltage 402 indicates a voltage at which the charge pump cells 440 should be presently outputting. The comparator 410 takes the reference voltage 402 and examines the voltage from the pump feedback loop to determine whether the charge pump 400 is operating as desired.

The comparator 410 provides two control output signals: a bias signal 412 and a frequency block signal 414. The bias signal 412 is an analog type signal from the differential amplifier 410 and its voltage level can vary from a ground potential to VCC or some designated voltage range. The bias signal 412 is coupled to an oscillator 420 and serves to control the clocking speed or oscillator frequency of the oscillator 420. For instance, the bias signal 412 can either increase or decrease the frequency of the oscillator 420 based on the voltage level of the bias signal 412. The comparator 410 uses the bias signal 412 to control the frequency in an analog fashion. Thus the oscillator 420 is gradually slowed down or sped up over time, rather than being switched on or off instantaneously.

The frequency blocking signal 414 is a digital output from the differential amplifier 410 and its value varies between a logic high and a logic low. The frequency blocking signal 414 also outputted from comparator 410 is a digital control signal to disable or enable the oscillator 420 and the phase clock generator 430. Unlike the analog bias signal 412 which needs time to propagate adjustments through the oscillator circuitry, this digital frequency blocking signal 414 can immediately operate the oscillator 420 and clock generator 430. The frequency blocking signal 414 goes directly to the last stage buffer of the logic blocks and disables the outputs there. The clocking and the pumping action terminates quickly because the last stage buffer is disabled before the effect of the bias signal 412 could work through the clocking logic circuits. For this embodiment, the frequency blocking signal 414 can override the bias signal 412. The oscillator output 422 is coupled to a phase clock generator 430. For this embodiment, the clock generator 430 provides four different clock signals CLK1 432, CLK2 434, CLK3 436, CLK4 438, with various phases. In other embodiments of charge pumps, the phase clock generator 430 can have more or less number of clock phases and output various other types of clock signals. The phase clock generator 430 drives the pumping action of the pump cells 440 with clock signals 432, 434, 436, 438.

In one embodiment, pump cells 440 may be a gate enhanced tri-channel triple well charge pump. An embodiment of pump cells 440 is discussed below with reference to FIGS. 6–10.

The phased clock signals 432, 434, 436, 438, are coupled to the pump cells 440. As the clock signals 432, 434, 436, 438, transition, the pump cells 440 of the charge pump operate to provide a pumped voltage 442. The pumped output voltage 442 from the pump cells 440 first passes through a large diode device 450. For this embodiment of a high precision pump regulation mechanism, the diode 450 is constructed with an S type field effect transistor. Alternatively, an S' device can be used in the diode 450. S devices are also known as low threshold voltage (Vt) N type field effect transistors. Similarly, S' devices are also low Vt N type field transistors, but S' devices have a threshold voltage lower than that of a S type device. Although S and S' type field effect transistors are described in the present embodiment of the invention, N type and/or N' type transistors may also be used in alternative embodiments.

Diode 450 here is a very low Vt diode device. The large diode 450 of this embodiment has a size of approximately 2000 square microns, but is not limited as such. This diode can be considered huge relative to typical transistor sized diodes placed in integrated circuits. For alternative embodiments, the diode 450 can have a size anywhere on the order of approximately 2000 square microns or greater. The low Vt and low pass diode device 450 filters out high frequency spikes and ripples in the pump cell output 442. For this embodiment, the voltage drop across the diode filter 450 due to current loading is absorbed by the charge pump 400 itself and is invisible to external circuits. In addition, each pump cell itself comprises a small diode device internally for the protection of the pump cell from back conductance in certain embodiments. This internal diode is not present in other embodiments. During pumping operation of the pump cells 440, voltage levels between the pump stages are switched back and forth. At different levels of the voltage changes, serious back conductance can occur.

The diode 450 shuts off automatically and stops supplying current from the pump cells 440 if the voltage level at its output starts to move above the level at its input terminal. If the diode 450 did not shut off, the pump cells 440 would continue to supply current until the feedback reached and notified the comparator 410 to shut down pump operations, which could be too late as the pump output has already overshot at that point in time. The diode 450 gates current from passing back to the pump cells 440. Thus the diode 450 can automatically shut down the power supply without waiting for the feedback response. The feedback response will occur, but at a later time. The output of the diode 450 is VOUT 452, also the charge pump output in this embodiment. VOUT 452 is the pumped supply voltage that can be used on various parts of the chip during algorithms.

VOUT 452 is also coupled to a resistor divider comprised of resistors R1 460 and R2 470. The resistor divider divides down VOUT 452 for the feedback loop. The pump feedback voltage 462 is taken between R1 460 and R2 470 of the resistor divider for comparison against the reference voltage 402 at the comparator 410. Thus the feedback loop of this embodiment extends from the comparator 410, through the oscillator 420, phase clock generator 430, pump cells 440, diode 450, R1 460, and back to the comparator 410. The pump voltage feedback 462 of this embodiment is sampled after the diode filter 450 instead of at the pump cell output 442 in order to reject unwanted pump overshoot and undershoot at the VOUT 452. The diode 450 also provides some feedback delay in the feedback loop. If the rippling of the pump output node has a high frequency, the lagging of diode can help to remove the rippling effect as VOUT 452 exceeds the pump cell output 442.

During operation, the comparator 410 enables the oscillator 420 with a bias signal 412. The phase clock generator 430 clocks the pump cells 440 of the charge pump based on an oscillator clock signal 422. The pump cells output a pumped voltage that is passed through a diode 450 to become a pumped supply voltage VOUT 452. VOUT 452 is sampled for the pump feedback voltage 462 between R1 460 and R2 470. The comparator 410 compares reference voltage 402 and the sampled pump feedback voltage 462 to determine whether VOUT 452, and essentially the charge pump operation, needs to be modified. In response to the comparison, the comparator 410 can alter the charge pump performance. If the comparator 410 determines that the pump feedback voltage 462 is low relative to the reference voltage 402, the pump cells 440 need to be enabled to provide a higher pumped voltage 442. Thus the comparator can increase the bias voltage 412 to the oscillator, which then responds with a higher frequency clock signal 422 to the phase clock generator 430. The higher frequency clock signal to the phase clock generator 430 will cause faster clock signals 432, 434, 436, 438, to increase the pumping operation of the pump cells, eventually increasing the pump output VOUT 452.

Alternatively, if the comparator 410 determines that the pump feedback voltage 462 is high relative to the reference voltage 402, the pump cells 440 need to be slowed to provide a lower pumped voltage 442. Thus the comparator can decrease the bias voltage 412 to the oscillator, which then responds with a lower frequency clock signal 422 to the phase clock generator 430. The lower frequency clock signal to the phase clock generator 430 will cause slower clock signals 432, 434, 436, 438, to decrease the pumping operation of the pump cells, eventually decreasing the pump output VOUT 452. But if the comparator 410 determines that VOUT 452 is extremely high and needs to be brought down quickly, the comparator can decrease pump output voltage 452 more quickly than biasing the oscillator 420 with a lower bias voltage 412. In other words, comparator 410 compares the feedback signal to a first voltage level and a second voltage level and responds to the comparison by either: increasing a frequency of the clock signal 422 if the feedback signal is less than first voltage level; decreasing the frequency of the clock signal 422 if the feedback signal is greater than the first voltage level; or disabling the clock signal if the feedback signal is greater than the second voltage level. The pump regulation mechanism of this embodiment can perform frequency blocking and control on all four phases from the clock drivers of the phase clock generator 430 for rapid pump shutdown to reduce pump overshooting.

The comparator 410 can use its frequency blocking signal 414 to turn off or disable operation of the oscillator 420 and the phase clock generator 430. The last stage buffers of the clock driver 430 are disabled by the frequency blocking signal to stop outputting phased clock signals. By deactivating the oscillator 420 and the phase clock generator 430, the phased clock signals 432, 434, 436, 438, stop toggling and the pump cells 440 cease pumping operation. The voltage level of VOUT 452 lowers as the charge at VOUT 452 dissipates. When comparator 410 senses from the pump feedback 462 that VOUT 452 has decreased sufficiently, the frequency blocking signal 414 turns back on and enables operation of the oscillator 420 and the phase clock generator 430. The charge pump 400 resumes normal operation and provides a pumped supply voltage again at VOUT 452.

Thus embodiments of the present invention can provide a solution for high precision wordline control for read and verify operations with MLC flash devices where large voltage variations cannot be tolerated. A charge pump regulation mechanism in accordance with the present invention enables the direct control of the charge pump output through a feedback back loop of the output voltage. For one embodiment of the pump regulation in accordance with the present invention, the total pump output voltage variation can be limited to 100 mV peak to peak or ±50 mV across varying process corners and conditions. Voltage variations at the pump output 452 are propagated back to the clocking circuits that drive the pump. The pump output in essence helps to signal whether the operation of the pump cells need to be increased, decreased, or even temporarily ceased. Without the sampling of the pump output voltage and the feeding back of that information to the pump cell control, the charge pump logic would not be able to determine whether the output voltage is at the desired voltage level or within the tolerance range. This more accurate control of the pump output voltage level is needed in the operation of MLC flash devices to ensure proper data. Embodiments of this invention can also assist in the operation of single bit flash devices to better control voltage variations.

Embodiments of the present invention may provide a solution for high precision wordline control for read and verify operations with MLC or single bit flash devices wherein a single charge pump is provided that may provide an output target voltage having a tolerance of less than about ±200 mV and in less than about 30 nanoseconds (ns) after transitioning to an active mode from a standby mode or an off condition. The single charge pump may also provide at least about one mA of electrical current at its output terminal.

Embodiments of the present invention can provide more precise regulation at minimal costs. The additional circuitry for the comparator 410, diode 450, and feedback loop use small amounts of space relative to the total area of the die. And yet, power savings occurs during standby and algorithm execution. The pump regulation mechanism of this embodiment does not impact pump performance in terms of speed or efficiency.

For an alternative embodiment, the comparator 410 can have multiple frequency blocking signals to separately disable/enable the oscillator 420 and the phase clock generator 430. Thus the comparator 410 of this alternative embodiment can disable or enable the oscillator 420 or the phase clock generator 430 at different points in time. However, if the oscillator 420 alone is turned off in an attempt to decrease or stop the pumping activity of the pump cells 440, a lower VOUT 452 can take a longer amount of time in order to be achieved. This is because the phase clock generator 430 does not immediately respond to the shutting off of the oscillator 420 and time is required to propagate the clock signals 422 prior to disabling of the oscillator 420. On the other hand, disabling the phase clock generator 430 alone without disabling the oscillator can also stop the pumping action at the pump cells 440. However, because the oscillator 420 continues to provide a clock signal 422, the phase clock generator 430 can become confused or restart in an awkward or unknown state later.

FIGS. 5A–D are flow diagrams illustrating one embodiment of a method for high precision regulation of a charge pump. At block 502 of FIG. 5A, a pumped voltage is generated. This pumped voltage is filtered through a low voltage drop diode device at block 504 to become a pumped supply voltage at the output of a charge pump. The pump output voltage is divided at block 506 to obtain a feedback voltage. At block 508, the divided pump voltage is fed back through a feedback loop to pump control logic, a comparator in this embodiment. A reference voltage is also received at the pump control logic at 510. This reference voltage serves as a target voltage level at which the charge pump should presently be generating.

Figure 5A:
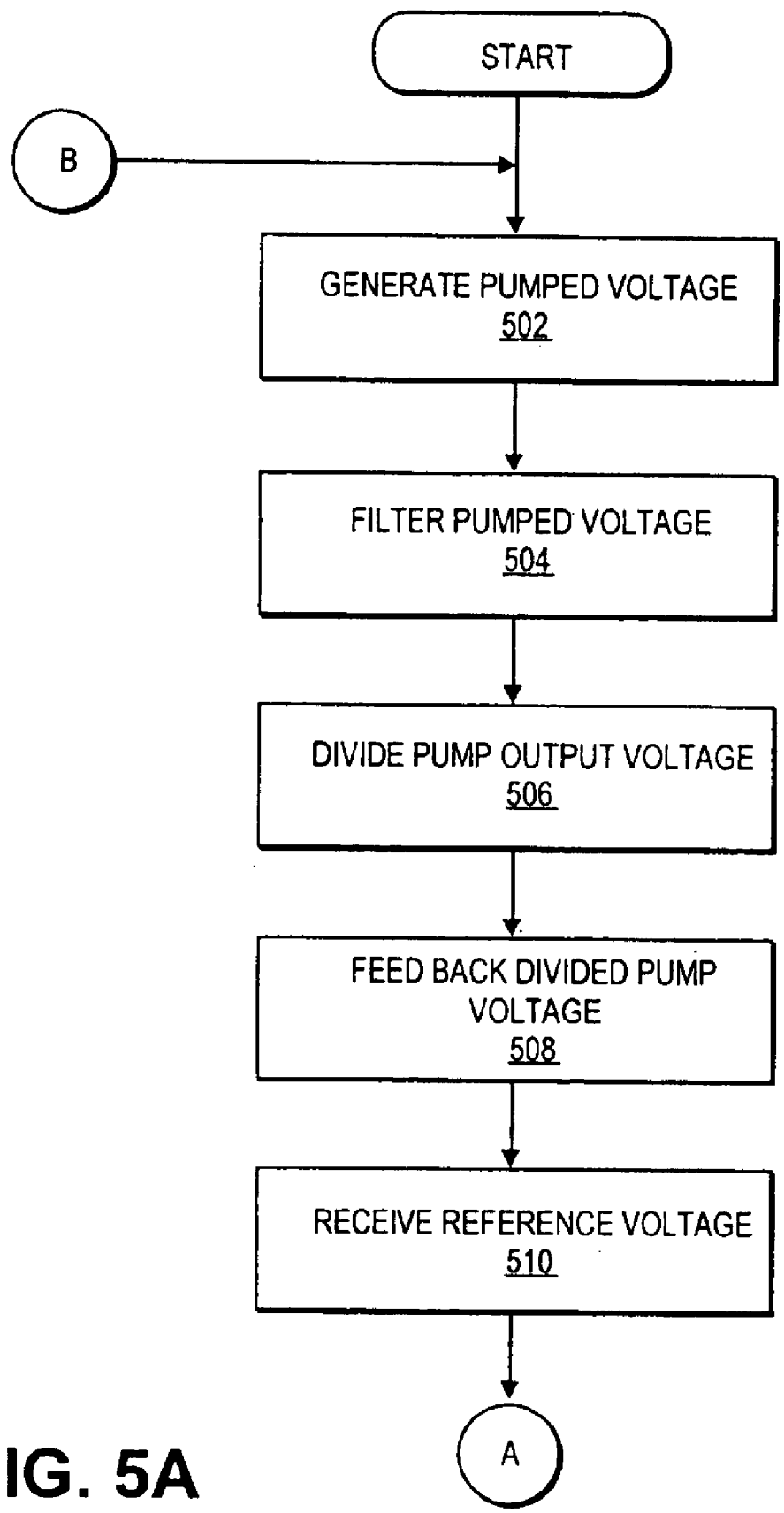
FIGS. 5A–5D are flow diagrams illustrating one embodiment of a method for high precision regulation of a charge pump.
Figure 5B:
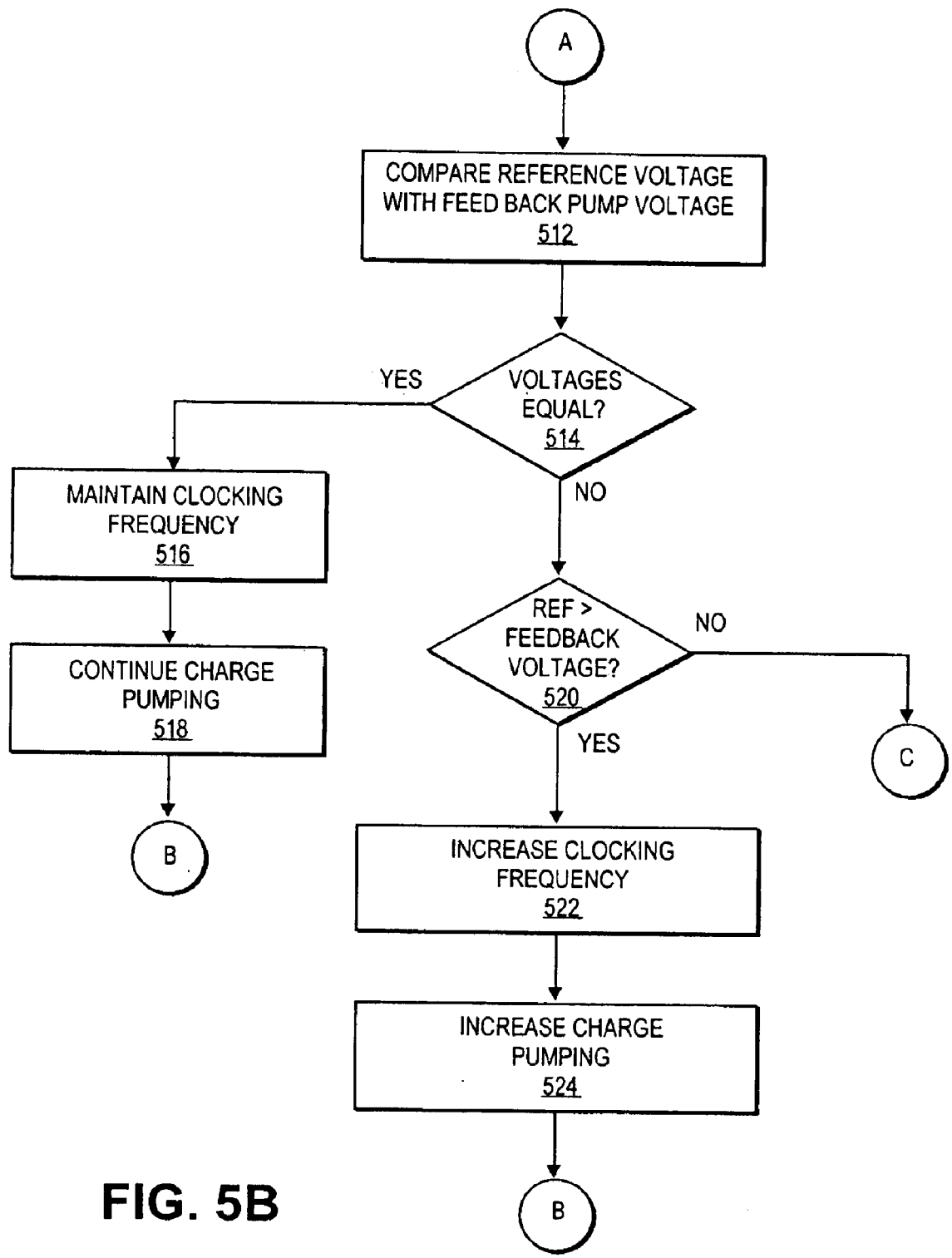
Figure 5C:
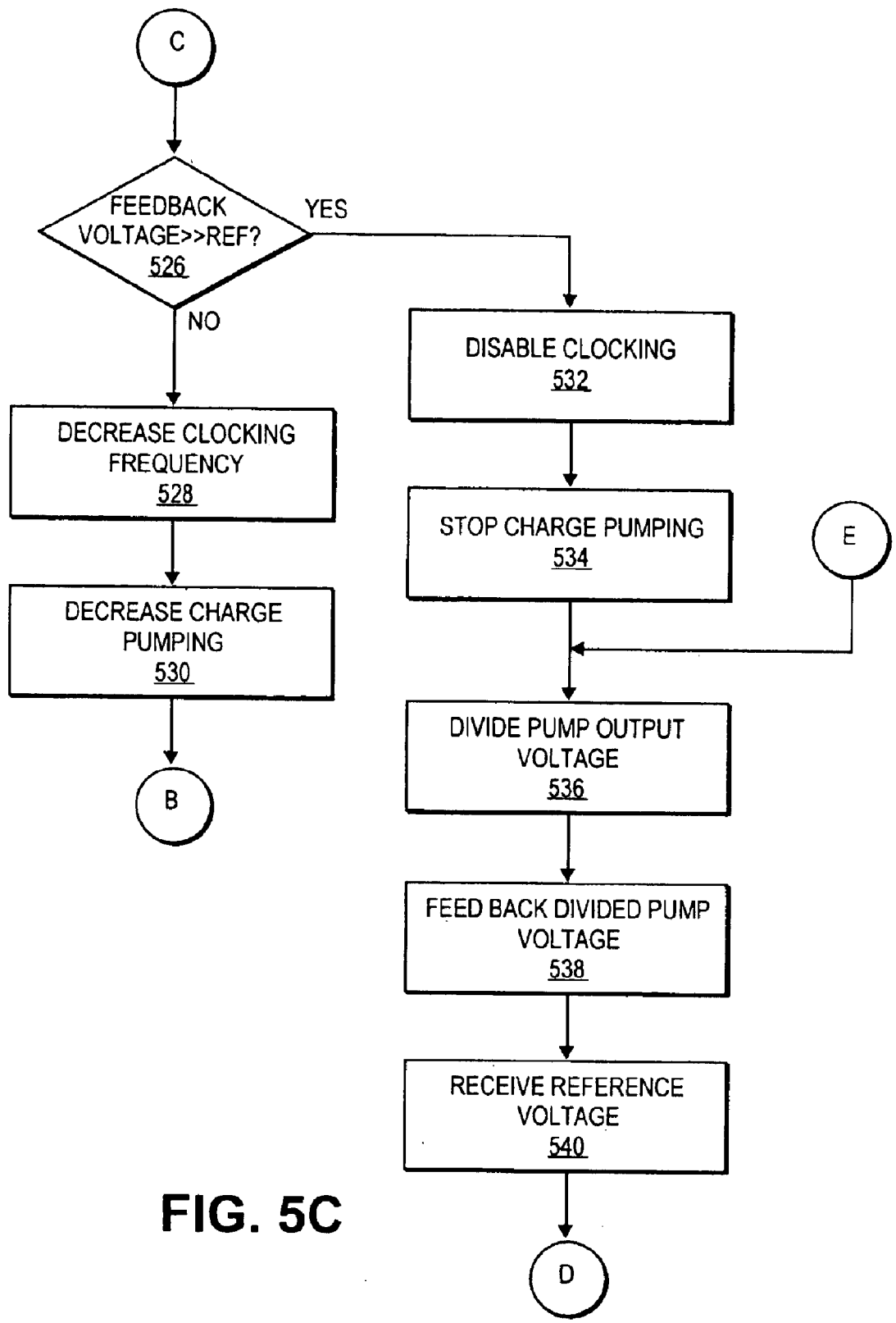

At block 512 of FIG. 5B, the reference voltage is compared with the fed back pump voltage at the comparator. The comparator determines whether the voltage levels are equal at block 514. If the voltages are equal, then the comparator maintains the present clocking frequency of the oscillator to the pump cells. The pump cells continue pumping at block 518. The pump cells proceed to generate a pumped voltage at block 502 as the cycle repeats.

But if the voltages are not equal at block 514, the voltages are also checked whether the reference voltage is greater than the pump feedback voltage at block 520. If the reference is greater than the feedback voltage, that condition indicates that the charge pump is not pumping enough and providing less than the presently desired voltage. In response, the pump control logic increases the clocking frequency of the oscillator to the pump cells at block 522. The charge pump cells increase the charge pumping operations due to the faster clock pulses at 524 to raise the voltage level at the pump output. The pump cells proceed to generate a pumped voltage at block 502 as the cycle repeats.

Now if the reference voltage is less than the pump feedback voltage at block 520, that condition indicates that either the charge pump has over pumped and providing more than the presently desired voltage or charge is being fed back to the charge pump output from circuits being supplied by the pump. At block 526 of FIG. 5C, the voltages are also checked whether the feedback voltage is much greater than the reference voltage. If the feedback voltage is not much greater than the reference voltage, the issue may be correctable with adjustments to the clocking. The comparator decreases the clocking frequency of the oscillator to the pump cells at block 528. The charge pump cells decrease pumping operations due to the slower clock pulses at block 530 to lower the voltage level at the pump output. The pump cells proceed to generate a pumped voltage at block 502 as the cycle repeats.

If the feedback voltage is determined to be much greater than the referenced voltage at block 526, the clocking to the pump cells is disabled at block 532. For one embodiment, the disable action entails disabling an oscillator and a phase clock generator. For another embodiment, the disable action involves the disabling of a last stage buffer at the clock output prior to the pump cells. At block 534, charge pump stops. Because charge pumping has ceased, charge is not being actively supplied from the charge pump. The output voltage from the charge pump should decrease in response as charge is being consumed by circuitry coupled to the pump output. The pump output voltage is divided at block 536 and fed back for sampling at block 538. The comparator received the pump feedback voltage and also the reference voltage at block 540.

Figure 5D:
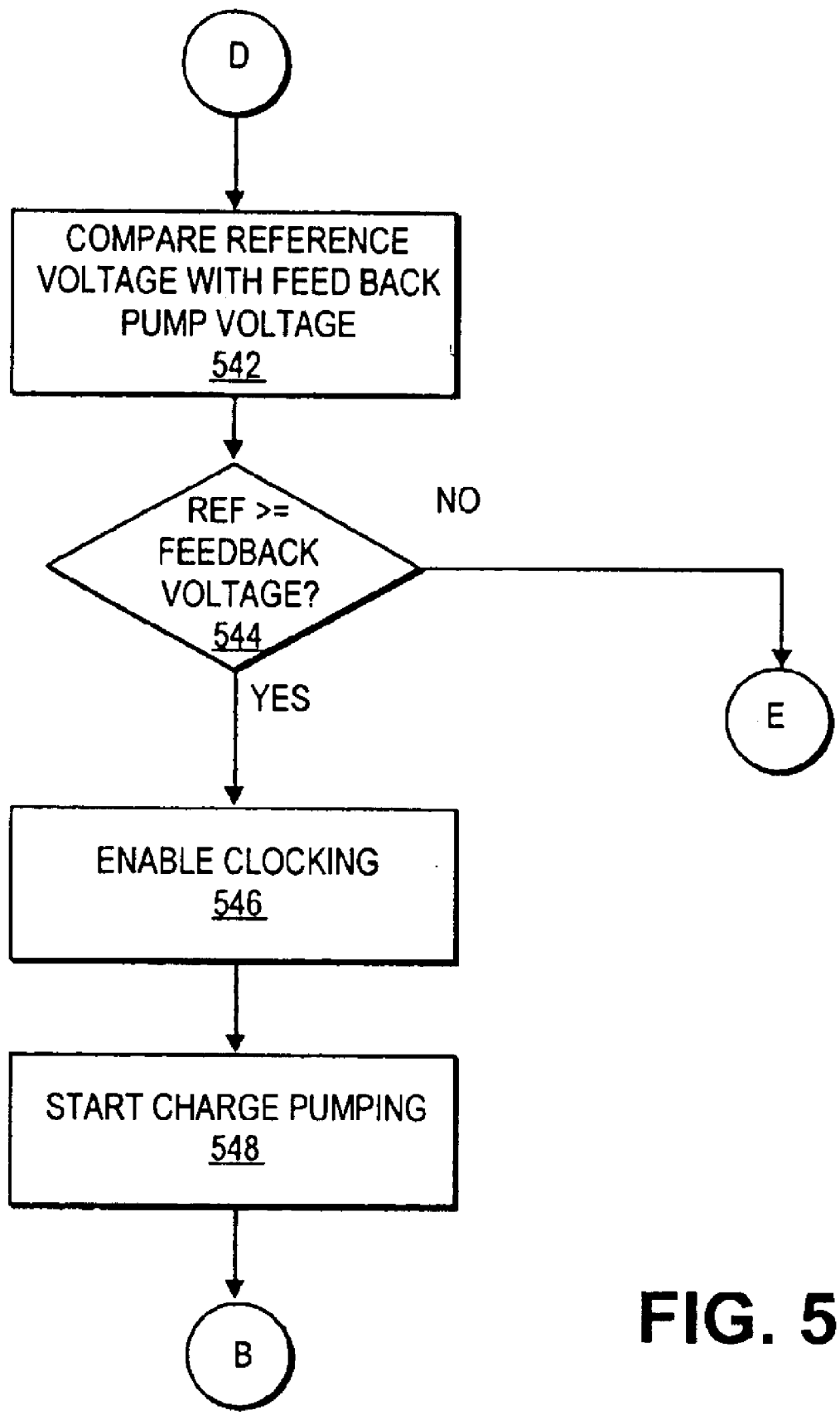

At block 542 of FIG. 5D, a comparison of the reference voltage and the pump feedback voltage is made. If the reference voltage is greater than or equal to the feedback voltage at block 544, that indicates that the pump output voltage has decreased sufficiently. Thus the charge pumping can resume. The clocking to the pump cells is enabled at block 546. For one embodiment, this involves enabling the last stage buffer of the clock generator in order to allow the clock phases to reach the pump cells. For another embodiment, the enabling action entails restarting an oscillator and/or a phase clock generator. The charge pumping resumes at block 548 and the pump cells proceed to generate a pumped voltage at block 502 as the cycle repeats.

Figure 6:
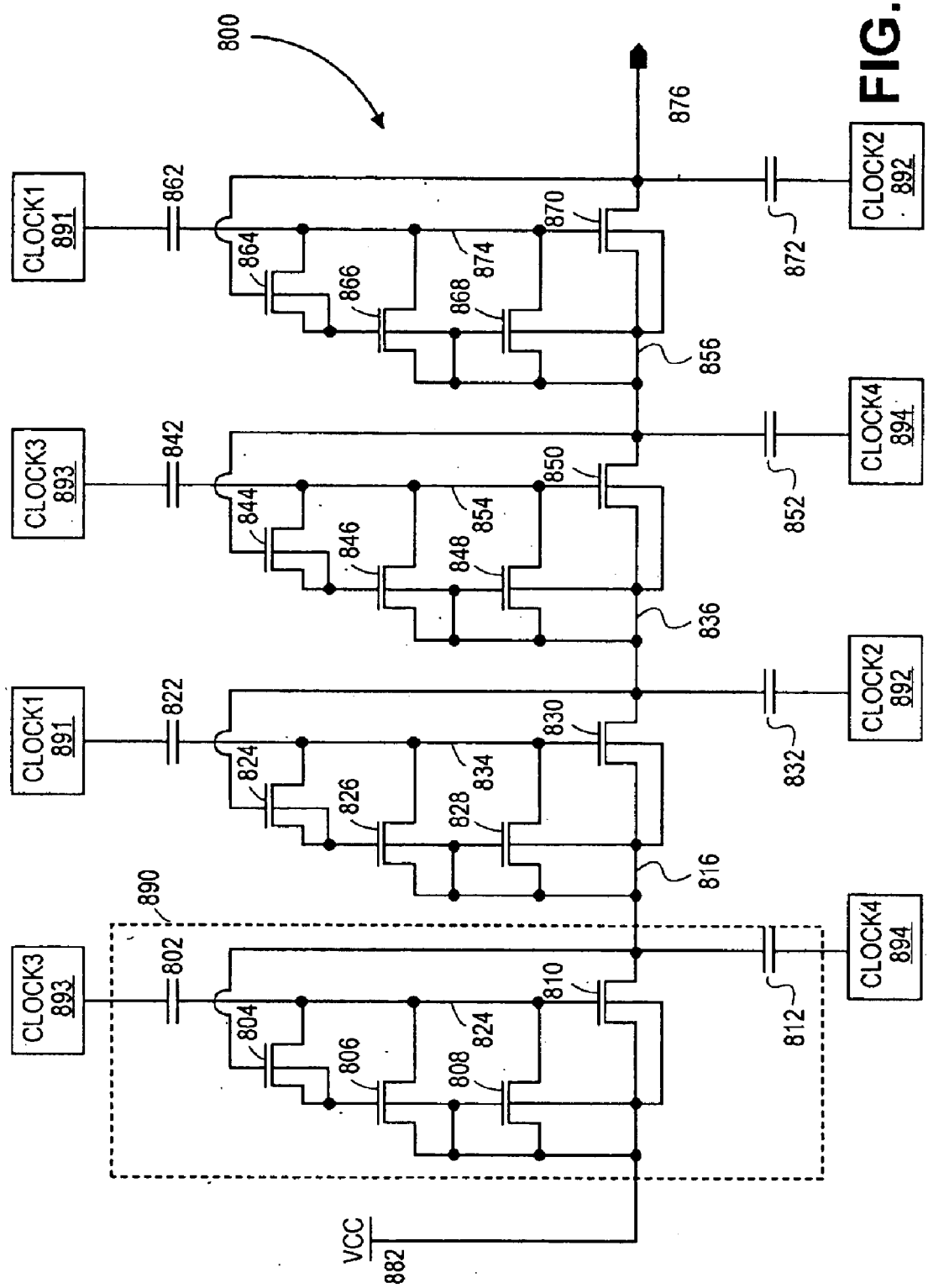
FIG. 6 illustrates a circuit diagram of a four stage gate enhanced tri-channel positive charge pump in accordance with one embodiment.

FIG. 6 is a circuit diagram of a gate enhanced tri-channel positive charge pump 800 of one embodiment. The single charge pump 800 may be used for the pump 440 illustrated in pump 400 illustrated in FIG. 7, wherein signals CLK1–CLK4 correspond to signals CLOCK 1–CLOCK 4, respectively. Terminal 882 may be referred to as an input terminal of pump 800 and terminal 876 may be referred to as an output terminal of pump 800.

Figure 8:
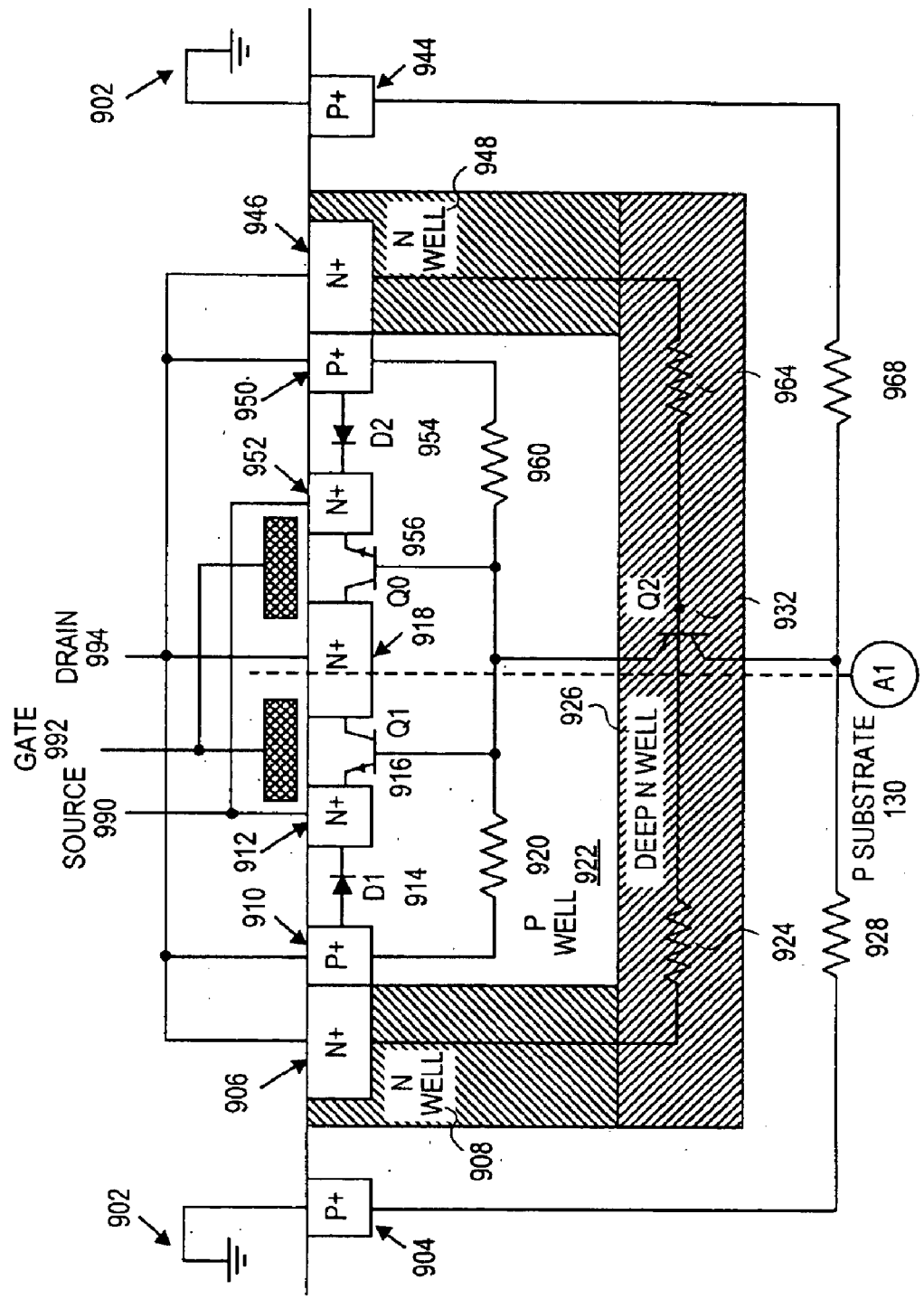
FIG. 8 illustrates a simplified cross-sectional view of a triple well N type transistor layout for a shared drain embodiment.
Figure 9:
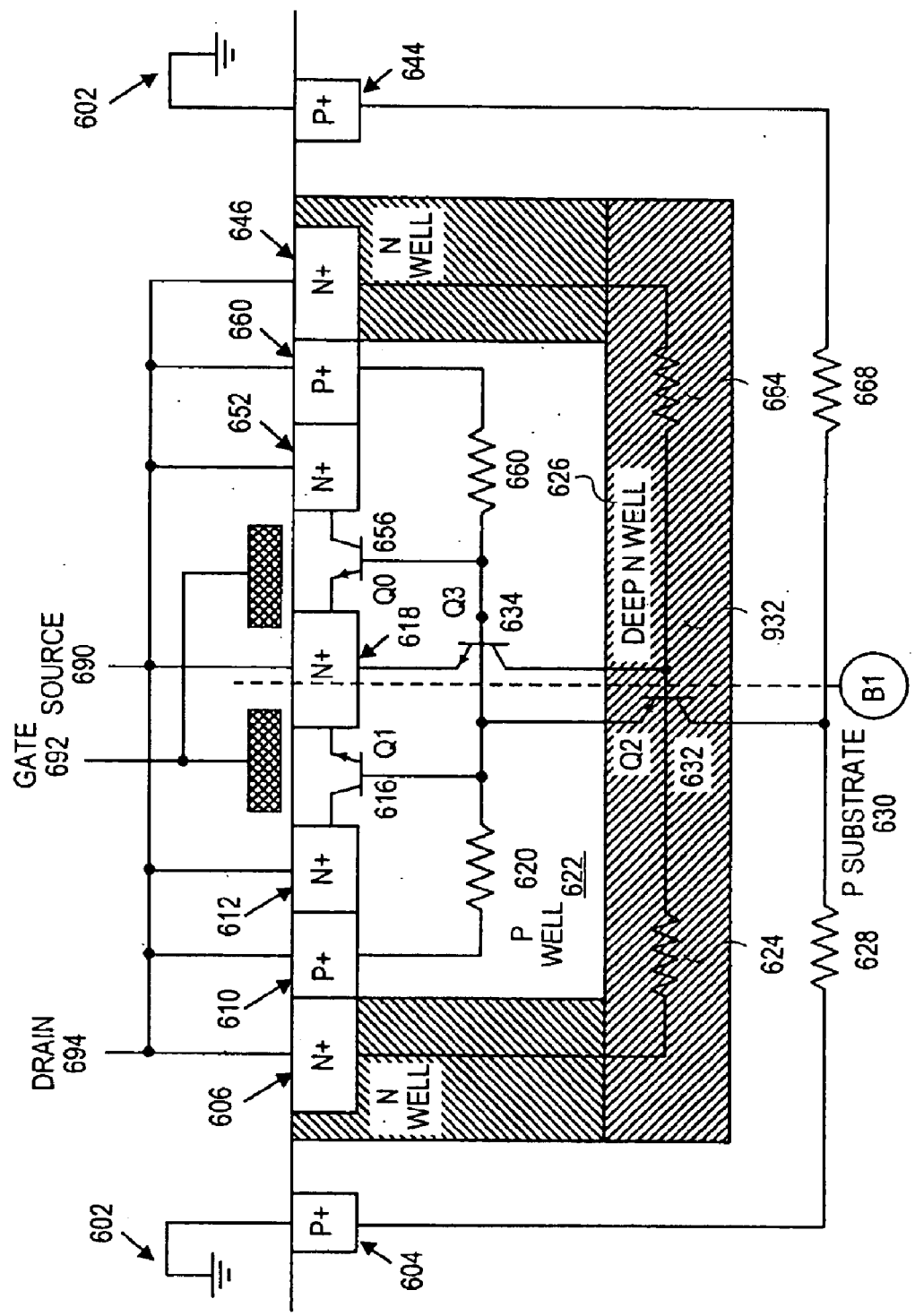
FIG. 9 illustrates a simplified cross-sectional view of a triple well N type transistor layout for a shared source embodiment.

The embodiment of FIG. 6 includes switching transistors 810, 830, 850, 870 connected in series between VCC 882 and VOUT 876. The switching transistors 810, 830, 850, 870 are preferably triple well N type field effect transistors. The larger sized passing devices 810, 830, 850, and 870 of this embodiment have two BJT current channels to help transfer charge in addition to its regular channel underneath the gate region, and therefore, may be referred to as a tri-channel device. FIG. 8 below which shows a simplified cross section of one of the legged common drain (or shared drain) passing gates wherein BJT Q0 or Q1 and BJT Q2 are engaged to help charge transfer when the drain and gate terminals are clocked to higher potential. Similarly, FIG. 9 shows a cross section of the legged common source (or shared source) layout version.

The embodiment of FIG. 6 further includes pull-up transistors 808, 828, 848, 868. The pull-up transistors 808, 828, 848, 868 are triple well N type field effect transistors in this embodiment. The source terminal of pull-up transistor 808, 828, 848, 868 is connected to the gate terminal of switching transistors 810, 830, 850, 870, respectively. The pull-up transistors 808, 828, 848, 868 are diode connected, with the drain terminal and the gate terminal of each pull-up transistor 808, 828, 848, 868 connected to the drain terminal of the respective switching transistor 810, 830, 850, 870.

The embodiment of FIG. 6 further includes pull-down transistors 806, 826, 846, 866. The pull-down transistors 806, 826, 846, 866 of this embodiment are triple well N type field effect transistors. The drain terminal of the pull-down transistor 806, 826, 846, 866 is connected to the gate terminal of the switching transistor 810, 830, 850, 870, respectively. The source terminal of the pull-down transistor 806, 826, 846, 866 is connected to the drain terminal of the switching transistor 810, 830, 850, 870, respectively. The gate terminal of the pull-down transistor 806, 826, 846, 866 is connected to the drain terminal of control device 804, 824, 844, 864, respectively.

For this embodiment of the present invention, a control device may serve as a switch between the gate and drain terminals of the pull-down transistor. The control device switches the pull-down transistor from being diode connected or not. Control devices 804, 824, 844, 864 are triple well N field effect transistors in this embodiment. The source terminal of control devices 804, 824, 844, 864 is connected to the gate terminal of switching transistor 810, 830, 850, 870, respectively. The gate terminal of control devices 804, 824, 844, 864 is connected to the source terminal of switching transistor 810, 830, 850, 870, respectively.

Control devices 804, 824, 844, 864 separate the boot node 814, 834, 854, 874 from the gate terminal of diode connected pull-down device 806, 826, 846, 866 respectively. The gates of the triple well N devices 804, 824, 844, 864 connect to the next higher pump node 816, 836, 856, 876, respectively, and stops the formerly diode connected 806, 826, 846, 866 from discharging the boot node 814, 834, 854, 874 while the node is being booted by CLOCK 3 or CLOCK 1, respectively. By controlling the discharge of boot node 814, 834, 854, 874 through the pull-down device 806, 826, 846, 866, respectively, more gate drive is available to the charge transfer device 810, 830, 850, 870. Thus more charge can be passed from one pump stage to the next pump stage.

The substrate terminals described in this embodiment are also referred to as the P-well connection of the triple well N type devices. Most of the substrate terminals of the N type transistor devices in each individual pump stage are tied together with the drain terminal of the switching transistor of that stage. The substrate terminals of 806, 808, and 810 are connected together with the drain terminal of 810 at VCC 882. The substrate terminals of 826, 828, and 830 are connected together with the drain terminal of 830 at node 816. The substrate terminals of 846, 848, and 850 are connected together with the drain terminal of 850 at node 836. The substrate terminals of 866, 868, and 870 are connected together with the drain terminal of 870 at node 856. Typically, the substrate of an N type device is connected to the most negative supply voltage in the circuit, which is a ground potential, to alleviate the body effect. With the triple well architecture, the well (substrate) can be biased to other voltage potentials and controlled as needed in the particular situation. The stress voltage inside the pump cell may also be reduced as the voltage between the well, which is at the drain potential, and the other junctions can be less than that with a ground potential.

In this embodiment, the substrate terminal of the control device 804, 824, 844, 864 is not connected together with the other substrate terminals of the other devices in the pump stage. The substrate and drain terminals of each control device 804, 824, 844, 864 are connected together with the respective gate terminal of the pull-down device 806, 826, 846, 866 in that pump stage.

Also included in the embodiment of FIG. 6 are storage capacitors 812, 832, 852, 872. Storage capacitor 812 is connected between a CLOCK 4 894 signal and the source terminal of switching transistor 810. Storage capacitor 832 is connected between a CLOCK 2 892 signal and the source terminal of the switching transistor 830. Storage capacitor 852 is connected between a CLOCK 4 894 signal and the source terminal of switching transistor 850. Storage capacitor 872 is connected between a CLOCK 2 892 signal and the source terminal of switching transistor 870.

The embodiment of FIG. 6 further includes boot node capacitors 802, 822, 842, 862. Boot node capacitor 802 is connected between a CLOCK 3 signal and the gate terminal of 810. Boot node capacitor 822 is connected between a CLOCK 1 891 signal and the gate of 830. Boot node capacitor 842 is connected between a CLOCK 3 893 signal and the gate of 850. Boot node capacitor 862 is connected between a CLOCK 1 891 signal and the gate of 870. In one embodiment, the clock signals 891, 892, 893, and 894 are generated by four phase clock generator 430 which takes its input from oscillator 420 as illustrated in FIG. 4.

Nodes 816, 836, 856, 876 are shown in FIG. 6. Node 816 is defined by the connection of storage capacitor 812, the source terminal of switching transistor 810, the gate terminal of control device 804, the drain terminal of switching transistor 830, the gate and drain terminals of pull-up transistor 828, and the source terminal of pull-down transistor 826. VCC 882 is connected to the drain terminal of 810, the gate and drain terminals of 808, and the source terminal of 806. Node 836 is defined by the connection of 832, the source terminal of 830, the gate terminal of 824, the drain terminal of 850, the gate and drain terminals of 848, and the source terminal of 846. Node 856 is defined by the connection of 852, the source terminal of 850, the gate terminal of 844, the drain terminal of 870, the gate and drain terminals of 868, and the source terminal of 866. Node 876 is defined by the connection of 872, the gate terminal of 864, and the source terminals of 870.

Boot nodes 814, 834, 854, 874 are also shown in FIG. 6. Boot node 814 is defined by the connection of the boot capacitor 802, the gate terminal of switching transistor 810, the source terminal of pull-up transistor 808, the drain terminal of pull-down transistor 806, and the source terminal of control device 804. Boot node 834 is defined by the connection of 822, the gate terminal of 830, the source terminal of 828, the drain terminal of 826, and the source terminal of 824. Boot node 854 is defined by the connection of 842, the gate terminal of 850, the source terminal of 848, the drain terminal of 846, and the source terminal of 844. Boot node 874 is defined by the connection of 862, the gate terminal of 870, the source terminal of 868, the drain terminal of 866, and the source terminal of 864.

The embodiment of FIG. 6 includes four gate enhanced tri-channel positive charge pump stages. One of these stages is labeled as stage 890, and includes the storage capacitor 812, the switching transistor 810, the pull-up transistor 808, the pull-down transistor 806, the control device 804, and the boot node capacitor 802. Stage 890 receives its input from a VCC supply source 882. The output of this charge pump embodiment is labeled as VOUT 876.

Although the multi-stage positive charge pump embodiment of FIG. 6 includes four stages, other numbers of stages are possible. In this embodiment, the four stages may be referred to as a single array. Although pump 800 is illustrated as having one array of four stages, this is not a limitation of the present invention. In other embodiments, pump 800 may have more than one array.

The number of arrays of pump 800 may be varied to vary the amount of electrical current provided at output terminal 876. For example, the number of arrays of pump 800 may be increased to increase the electrical current provided at output terminal 876, and conversely, fewer arrays may be used to decrease the amount of electrical current provided at output terminal 876.

The number of stages of pump 800 may be varied to vary the voltage potential provided at output terminal 876. For example, the number of stages of pump 800 may be increased to increase the voltage potential provided at output terminal 876, and conversely, fewer stages may be used to decrease the voltage potential provided at output terminal 876. As one example, five arrays of four stages may be used in pump 800 to provide a voltage potential of about 5 volts and an electrical current of about one mA at output terminal 876.

Furthermore, the same techniques and teachings of the present invention can be applied to negative charge pumps and other applications wherein a positive or negative voltage potential greater than that of a supply voltage is needed to be generated internally. The present invention can be used in a variety of charge pumps to improve the output current and pumping efficiency. The increased output and efficiency may also lead to die size savings if the size of the charge pumps can be reduced as a result.

Figure 7:
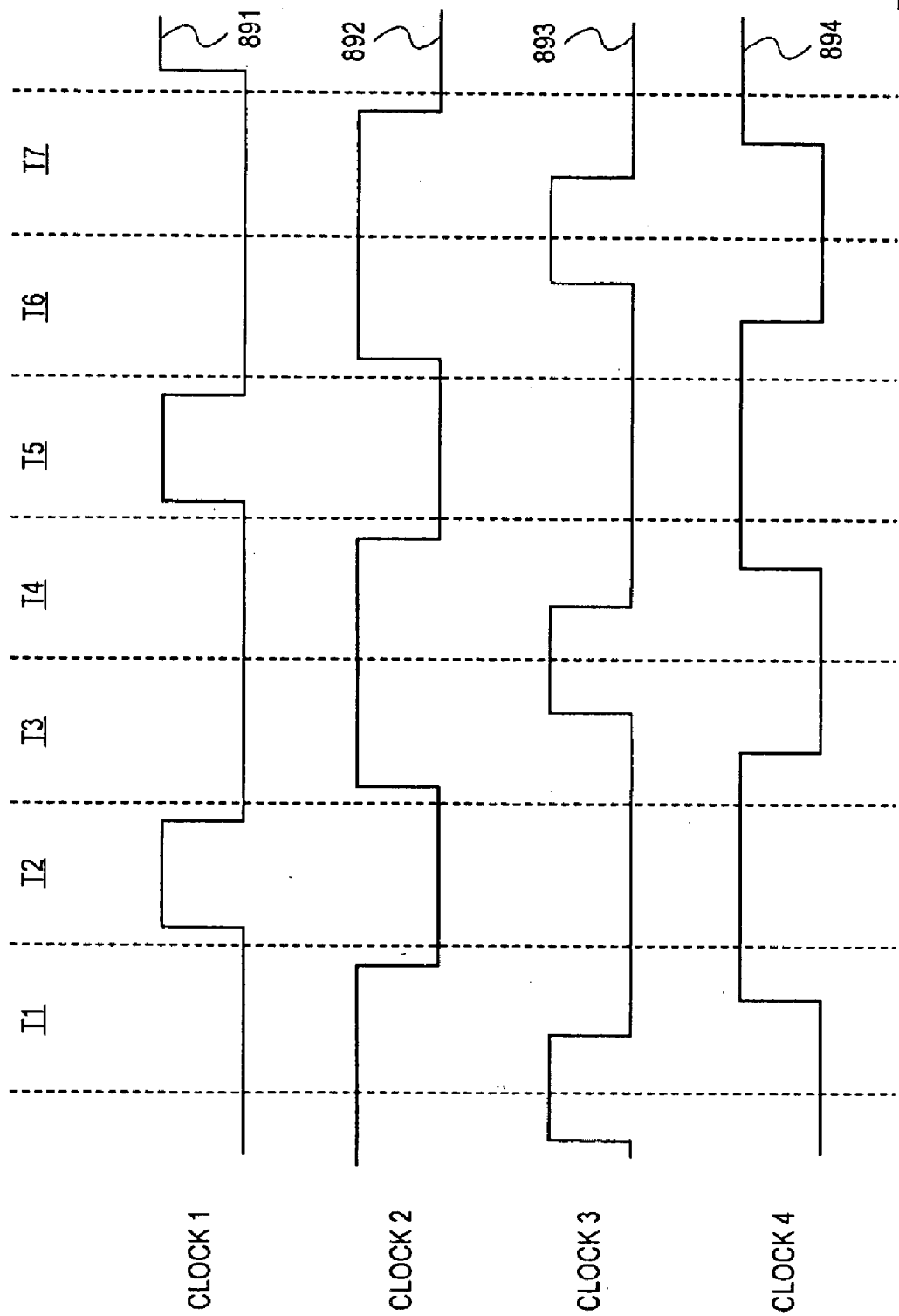
FIG. 7 shows a timing diagram of the pump clocking waveforms used in connection with the positive charge pump of FIG. 6.

FIG. 7 shows a timing diagram of the pump clocking waveforms used in connection with the positive charge pump 800 of FIG. 6. The clock signals CLOCK 1 891, CLOCK 2 892, CLOCK 3 893, CLOCK 4 894 control the operation of this embodiment of a positive charge pump 800. For this embodiment, all of the clock signals 891, 892, 893, 894 are at VCC level when high and at ground potential when low. VCC level varies depending on the particular embodiment and could possibly be 3V, 1.8V, or 1.55V, although the scope of the present invention is not limited in this respect.

The pumping operation can be abbreviated as the following steps and the repeat of those steps to generate currents. The following discussion will concentrate on the operation of pump 800 beginning with the first low-to-high transition of CLOCK 4 894 at time T1. When CLOCK 4 894 is high, the potential at node 816 is boosted high. The high potential at node 816 pre-charges the boot node 834 of the second stage through 828 and turns on 804. Boot node 834 is charged to a voltage potential of one threshold voltage less than the voltage on node 816. Because of the voltage on boot node 834, switching transistor 830 is nearly turned on. As 804 turns on, 806 is activated to discharge boot node 814 of the first stage 890. Discharging boot node 814 prevents back conductance through 810 between node 816 and VCC 882. When CLOCK 2 892 transitions low, the voltage potential at node 836 drops low to be ready to receive charge from 812 at node 816 and turns off 824. Bipolar junction transistor devices Q0 956 (656) or Q1 916 (616) as shown in FIG. 8 (and FIG. 9) below are turned on underneath 830 to help transfer charge before the 830 is actually turned on. Q2 932 (632) can also be turned on to help transfer charge. When CLOCK 1 891 transitions high, boot node 834 goes high and 830 gets turned on. Charge is transferred from 812 at node 816 through 830 to 832 at node 836. The voltage potential at node 816 decreases while the potential at node 836 increases. As CLOCK 1 891 transitions back to a logic low, the charge transfer from node 816 to node 836 stops and the voltage level on the nodes level out.

When CLOCK 2 892 goes high, the voltage potential at node 836 also goes high. 842 on boot node 854 is pre-charged by 832 through 848. The high potential on node 836 also turns on 824, which activates 826 to discharge boot node 834. Discharging boot node 834 turns off 830 to prevent back conductance from node 836 to node 816. When CLOCK 4 894 transitions low at time T3, the voltage potential on 852 at node 856 drops low in order to be ready to receive charge from 832 at node 836. A low on CLOCK 4 894 also turns off 844. Bipolar junction transistor devices Q0 956 (656) or Q1 916 (616) as shown in FIG. 8 (and FIG. 9) below are turned on underneath 850 to help transfer charge before the 850 is actually turned on. Q2 932 (632) may also be turned on to help transfer charge.

As CLOCK 3 893 transitions high during time T3, boot node 854 of the third stage also goes high. A high CLOCK 3 893 turns on switching transistor 850. Charge is transferred from 832 through 850 to 852, causing the voltage potential on node 836 to drop and the potential on node 856 to rise. When CLOCK 3 893 goes low during time T4, the charge transfer stops. The potentials on node 836 and node 856 level out. The cycle repeats with the low to high transition of CLOCK 4 894 at time T4.

The embodiment of FIG. 6 may eliminate the any use of overlapping clock periods typically found with prior charge pump circuits. Overlapping clock periods are not used in the embodiment of FIG. 6 because the voltage on the boot nodes 814, 834, 854, 874 are dependent on the voltages on the nodes 882, 816, 836, 856, respectively, and not on the voltage present at the following stage, as is the case with prior pump circuits. The elimination of the overlapping clocks may allow for an increase in clock frequency, which improves pump circuit performance.

Although the clocks signals 891, 892, 893, 894 of FIG. 7 are shown to not overlap, in other words no two clock edges are shown to occur simultaneously, there is no requirement for the clocks to not overlap. Clock edges may occur nearly simultaneously, although a small overlap, preferably approximately 2 nanoseconds for one embodiment, may be used in order to account for the non-vertical nature of clock edges.

The semiconductor structures and formations of FIGS. 8 and 9 are in general terms in order to avoid obfuscating the present invention. Details related to semiconductor processing and fabrication of metal oxide semiconductor (MOS) devices are known by those of ordinary skill in the art of semiconductors. FIG. 8 is a simplified cross-sectional view of a triple well N type transistor layout for a shared drain embodiment. The structures of this embodiment are formed on a P type substrate 930. P+ type substrate contacts 904, 944 connect the substrate 930 to a ground potential 902. An N type well including the regions N well 908, deep N well 926, and N well 948 is formed within the P type substrate 930. The N well regions 908, 948 may be doped differently from the deep N well region in some embodiments. N+ type well contacts 906, 946 are located in the N well regions 908, 948. A P type well 922 is formed within the N type well regions 908, 926, 948. P+ type well contacts 910, 950 are formed in the P well 922.

For this embodiment, an N type transistor device is formed in this P well region 922. N+ type doped regions 912, 918, 952 are formed in the P well 922. The N type transistor in the embodiment of FIG. 8 includes two legs with a shared drain region 918. The first leg of the transistor device is on the left side of the A1 line and a second leg is located on the right side of the A1 line. The legging of the transistor device in this embodiment of an N type transistor may provide savings in the die area. Instead of having a long transistor device wherein the drain and source regions extend parallel for the width, the implementation of different legs to a transistor device may allow sharing of the drain region 918 between adjacent legs. Legging may also reduce the size of the needed P type and N type wells. This smaller physical layout of a transistor device may also lead to reduced capacitance from the deep N well.

In this embodiment, the source regions of the two legs may be formed by the N+ doped regions 912, 952. The shared N+ type doped region 918 serves as the common drain region for the two legs. A first gate resides above the channel region between the source region 916 and drain region 918. A second gate resides above the channel region between the N+ source region 956 and drain region 918. Hence the first leg of the transistor device comprises of an N+ drain region 918, an N+ source region 912, and a gate over the channel region. The second leg of the transistor device comprises of an N+ drain region 918, an N+ source region 952, and a gate over the channel region. The drain region 918 is connected to a drain terminal 994. The N well and P well 922 are also connected to the drain terminal 994 through the respective N+ well contacts 906, 946 and P+ well contacts 910, 950. The gates of the two legs are connected together at the gate terminal 992. Similarly, the source regions 912, 952 are connected together at source terminal 990.

Inherent to the formation of the N type and P type regions in the semiconductor structure are parasitic resistances and PN/NPN/PNP devices. These NPN and PNP devices are also referred to as bipolar junction transistors (BJTs). BJTs are formed in the shared wells of this embodiment. For instance, a PN diode D1 is formed between the P+ well contact 910 and the source region 912 and also between P+ well contact 950 and the source region 952. A lateral parasitic NPN transistor Q1 916 is formed with the N+ drain region 918 as the collector, the P well 922 as the base, and the N+ source region 912 as the emitter. A similar lateral parasitic NPN transistor Q0 956 is formed with the N+ drain region 918 as the collector, the P well 922 as the base, and the N+ source region 952 as the emitter. A vertical parasitic PNP transistor Q2 932 is also formed with the P type substrate 930 as the collector, the deep N well 926 as the base, and the P well 922 as the emitter. The parasitic resistances such as 920, 960, 924, 964, 928, and 968 serve to complete the connection between the terminals of these BJTs Q0 956, Q1 916, Q2 932 and other contacts in the semiconductor.

As described above in the embodiments of FIGS. 6 and 8, the well terminals of the N type transistor devices may be coupled to the drain terminal of the N type transistor devices. This circuit arrangement may allow for the enabling of the parasitic BJT devices to assist in the transfer of charge between the drain and source terminals of the NMOS transistor devices in triple well semiconductor process technology. By increasing the charge transfer of the N type devices, the efficiency of a charge pump using such transistor devices can also improve. As a result, pump area can be reduced to reflect the higher efficiency, resulting in die savings.

FIG. 9 is a simplified cross-sectional view of a triple well N type transistor layout for a shared source embodiment. The structures of this embodiment are formed on a P type substrate 630. P+ type substrate contacts 604, 644 connect the substrate 630 to a ground potential 602. An N type well including the regions N well 608, deep N well 626, and N well 648 is formed within the P type substrate 630. N+ type well contacts 606, 646 are located in the N well regions 608, 648. A P type well 622 is formed within the N type well regions 608, 626, 648 with P+ type well contacts 610, 650.

N+ type doped regions 612, 618, 652 are formed in the P well 622. The N type transistor in this embodiment includes two legs with a shared source region 618. The first leg of the transistor device is on the left side of the B1 line and a second leg is located on the right side of the B1 line. The implement of different legs to a transistor device may allow sharing of the source region 618 between adjacent legs.

In this embodiment, the drain regions of the two legs are formed by the N+ doped regions 612, 652. The shared N+ type doped region 618 serves as the common source region for the two legs. A first gate resides above the channel region between the source region 618 and drain region 612. A second gate resides above the channel region between the N+ source region 618 and drain region 652. Hence the first leg of the transistor device comprises of an N+ drain region 612, an N+ source region 618, and a gate over the channel region. The second leg of the transistor device comprises of an N+ drain region 652, an N+ source region 618, and a gate over the channel region. The source region 618 is connected to a drain terminal 690. The gates of the two legs are connected together at the gate terminal 692. Similarly, the drain regions 612, 652 are connected together at drain terminal 694 along with the N well and P well 622 through their respective N+ well contacts 606, 646 and P+ well contacts 610, 650.

Inherent to the formation of the N type and P type regions in the semiconductor structure are parasitic resistances and PN/NPN/PNP devices. A parasitic NPN transistor Q1 616 is formed with the N+ drain region 612 as the collector, the P well 622 as the base, and the N+ source region 618 as the emitter. A similar parasitic NPN transistor Q0 656 is formed with the N+ drain region 652 as the collector, the P well 622 as the base, and the N+ source region 618 as the emitter. A third parasitic NPN transistor Q3 634 is formed with the deep N well region 626 as the collector, the P well 622 as the base, and the N+ source region 618 as the emitter. A parasitic PNP transistor Q2 632 is also formed with the P type substrate 630 as the collector, the deep N well 626 as the base, and the P well 622 as the emitter. The parasitic resistances such as 620, 660, 624, 664, 628, and 668 to complete the connections between the terminals of these BJTs Q0 656, Q1 616, Q2 632, Q3 634 and other contacts in the semiconductor.

Figure 10:
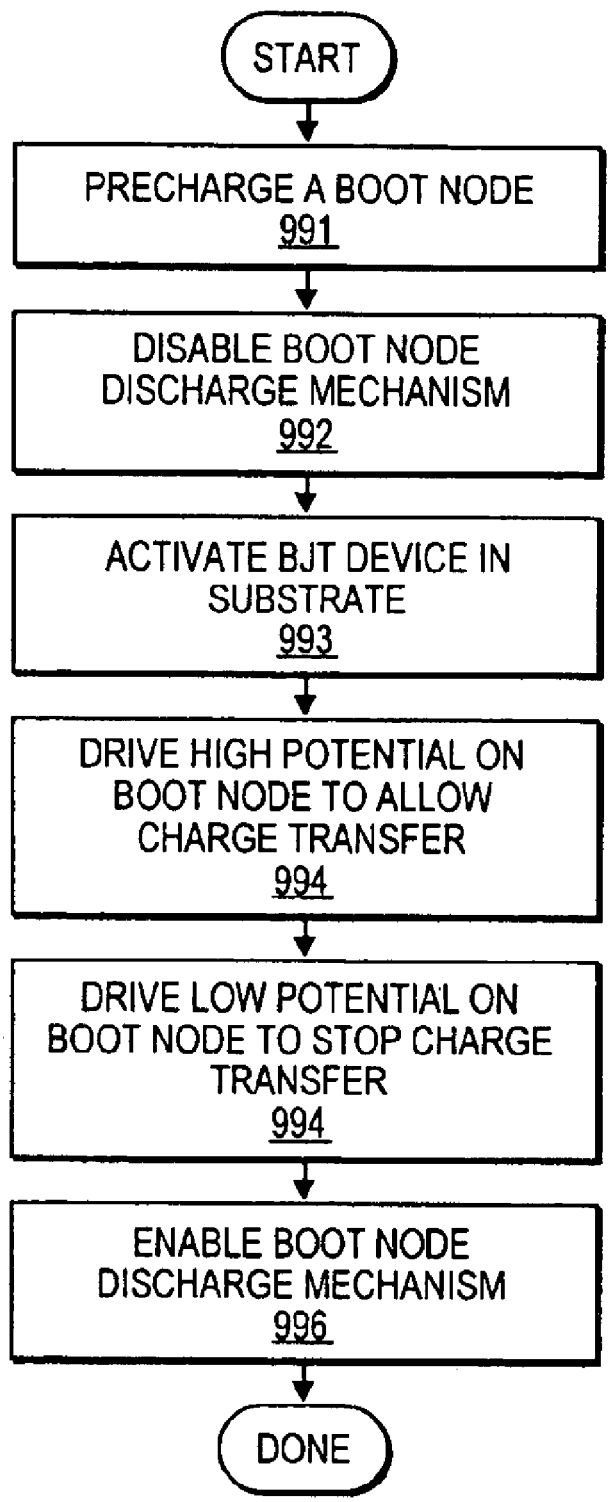
FIG. 10 is a flow diagram illustrating a method for enhancing charge transfer in a triple well charge pump of one embodiment.

FIG. 10 is a flow diagram illustrating a method for enhancing charge transfer in a triple well charge pump of one embodiment. This example generally may describe the operation of one pump stage of pump 800 shown in FIG. 6. At block 991, a boot node is precharged. The boot node discharge mechanism is disabled at block 992. This discharge mechanism can be viewed as the pull-down device as in the pump cells of FIG. 6. A BJT device is activated in the substrate at block 993. The BJT device of this embodiment is a lateral BJT underneath the N type transistor device within the P well of the triple well structure. At block 994, a logic high level is driven on the boot node to allow charge transfer to occur. This charge transfer can be related to the charge being passed from a storage capacitor of an earlier stage through a switching device over to a storage capacitor of a subsequent stage. A logic low level is driven on the boot node at block 995 to stop the charge transfer. At block 996, the boot node discharge mechanism is enabled to fully turn off the charge passing device.

The cycle from block 991 to step 996 repeat again and again to continually pass charge from the input of the pump cell to the output of the pump cell. The operation of subsequent pump cells in the charge pump operate in a similar manner, but the clocking are timed differently between adjacent cells in order to properly pump up the voltage.

Thus embodiments of the present invention provide a tri-channel triple well NMOS positive charge pump. In the positive pump architecture, the deep N well of each transistor device is connected to its drain terminal. The P well in this implementation is also connected up to the deep N well. This gate enhancement switching architecture refers to the increased charge transfer in an N type transistor device in combination with triple well technology. Embodiments of the present invention configure a triple well N channel transistor device to intentionally create a vertical bipolar junction transistor (BJT) device and a horizontal BJT to help increase the charge transfer. Accordingly, there are three channels for transferring charge between storage capacitors, one channel or path between the drain and source of a FET and also two paths using the BJT devices.

The BJTs are formed when the N device's deep N well and the P well are connected to its drain terminal. By biasing the wells of the N type device with the potential at its drain in one embodiment, the body effect of the pump stages can be eliminated. The higher biased P well potential can also effectively reduce the threshold voltage $Vt_N$ of an N type transistor device. Lower voltage requirements to activate individual transistors can lead to power savings in the overall circuit.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus, comprising:
   a memory to store information;
   a single charge pump to provide a read voltage having a tolerance of less than about +200 millivolts (mV) at an output terminal of the single charge pump, wherein the output terminal of the single charge pump is coupled to the memory to couple the read voltage to the memory to read information stored in the memory and wherein the single charge pump includes:
   a diode coupled to an output terminal of the single charge pump, wherein the read voltage is provided at a terminal of the diode;
   a clock circuit to provide a first clock signal to a pump cell of the single charge pump circuit, wherein the diode is coupled to the pump cell; and
   a control circuit to provide an enable signal to the clock circuit and to provide a bias signal to the clock circuit to control the frequency of the first clock signal.

2. The apparatus of claim 1, wherein the single charge pump is adapted to provide a read voltage having a tolerance of about +50 mV and wherein the memory is a nonvolatile flash memory array of flash memory cells adapted to store at least two bits of information in each memory cell.

3. The apparatus of claim 1, wherein the single charge pump is adapted to provide the read voltage having a tolerance of less than about +200 mV at the output terminal of the single charge pump in response to a positive supply voltage at an input terminal of the single charge pump, wherein the positive supply voltage is less than the read voltage.

4. The apparatus of claim 3, wherein the positive supply voltage is less than five volts and the read voltage is at least five volts.

5. The apparatus of claim 3, wherein the single charge pump provides at least one milliampere (mA) of electrical current at the output terminal of the single charge pump after receiving the positive supply voltage at the input terminal of the single charge pump.

6. The apparatus of claim 3, further comprising: wherein the single charge pump provides the read voltage in less than about 30 nanoseconds (ns) after transitioning from a standby mode of the single charge pump to an active mode of the single charge pump.

7. The apparatus of claim 1, wherein the single charge pump is a positive charge pump.

8. The apparatus of claim 1, further comprising a switch coupled between the output terminal of the charge pump and the memory.

9. The apparatus of claim 1, wherein the single charge pump includes at least one stage comprising:
   a first transistor having a first terminal coupled to an input terminal of the single charge pump, a second terminal coupled to receive a first clock signal, and a third terminal coupled to the output terminal of the single charge pump; and
   a first capacitor having a first terminal coupled to the third terminal of the first transistor and a second terminal coupled to receive a second clock signal.

10. The apparatus of claim 9, wherein the at least one stage further comprises:
    a second capacitor having a first terminal coupled to receive a second clock signal and a second terminal coupled to the second terminal of said first transistor;
    a second transistor having a first terminal coupled to the first terminal of the first transistor, a second terminal coupled to the first terminal of the first transistor, and a third terminal coupled to the second terminal of the first transistor;
    a third transistor having a first terminal coupled to the first terminal of the first transistor, a second terminal, and a third terminal coupled to the second terminal of the first transistor; and a fourth transistor having a first terminal coupled to the second terminal of the third transistor, a second terminal coupled to the third terminal of the first transistor, and a third terminal coupled to the second terminal of the first transistor.

11. The apparatus of claim 1, wherein the clock circuit includes:

an oscillator to provide an oscillating clock signal at an output terminal of the oscillator; and a phase clock generator to generate the first clock signal in response to the oscillating clock signal.

12. The apparatus of claim 1, wherein the control circuit includes a comparator having a first input terminal coupled to receive a reference voltage, a second input terminal coupled to the output terminal of the single charge pump, a first output terminal coupled to a first input terminal of the clock circuit to provide the bias signal and a second output terminal coupled to a second input terminal of the clock circuit to provide the enable signal.

13. The apparatus of claim 1, further comprising a resistor divider coupled between an output terminal of the single charge pump and an input terminal of the control circuit.

14. The apparatus of claim 1, wherein the bias signal is an analog signal and wherein the enable signal is a digital signal.

15. A method, comprising generating a read voltage having a tolerance of less than about ±200 mV from a single charge pump;

transferring the read voltage to a memory to read information stored in the memory;

generating a feedback signal that corresponds to the read voltage; and comparing the feedback signal to a reference signal to generate a bias signal and an enable signal to provide to a clock circuit.

16. The method of claim 15, further comprising generating at least about one milliampere (mA) of electrical current from the single charge pump during reading of information stored in the memory.

17. The method of claim 15, further comprising transitioning the output voltage of the single charge pump from about zero volts to the read voltage in less than about 30 nanoseconds (ns).

18. The method of claim 15, further including:

transferring a first clock signal to the single charge pump circuit;

generating a first control signal to alter the frequency of the first clock signal; and generating a second control signal to disable or enable the first clock signal.

19. The method of claim 18, wherein generating the first control signal includes generating an analog signal and wherein generating the second control signal includes generating a digital signal.

20. The method of claim 15, further comprising:

comparing the feedback signal to a first level and a second level;

responding to the comparing by either:

increasing a frequency of the first clock signal if the feedback signal is less than first level;

decreasing the frequency of the first clock signal if the feedback signal is greater than the first level; or disabling the clock signal if the feedback signal is greater than the second level.

21. A system, comprising:

a controller;

a wireless transceiver coupled to the controller;

a memory coupled to the controller; and a single charge pump to provide a read voltage having a tolerance of less than about +200 millivolts at an output terminal of the single charge pump, wherein the output terminal of the single charge pump is coupled to the memory to couple the read voltage to the memory to read information stored in the memory and wherein the single charge pump includes:

a diode coupled to an output terminal of the single charge pump, wherein the read voltage is provided at a terminal of the diode;

a clock circuit to provide a first clock signal to a pump cell of the single charge pump circuit, wherein the diode is coupled to the pump cell; and a control circuit to provide an enable signal to the clock circuit and to provide a bias signal to the clock circuit to control the frequency of the first clock signal.

22. The system of claim 21, wherein the memory is a flash memory including a plurality of memory cells, wherein at least one memory cell of the plurality of memory cells is capable of storing at least two bits of information in the at least one memory cell.

23. The apparatus of claim 21, wherein the single charge pump is adapted to provide the read voltage having a tolerance of less than about +200 mV at the output terminal of the single charge pump in response to a positive supply voltage at an input terminal of the single charge pump, wherein the positive supply voltage is less than the read voltage.

24. The apparatus of claim 23, wherein the single charge pump provides at least one milliampere (mA) of electrical current at the output terminal of the single charge pump after receiving the positive supply voltage at the input terminal of the single charge pump.

* * * * *